(12) United States Patent
Niu et al.

(10) Patent No.: US 12,375,108 B2
(45) Date of Patent: Jul. 29, 2025

(54) INFORMATION BIT DETERMINATION METHOD AND MAPPING GENERATION METHOD FOR POLAR-CODED MODULATION, AND DEVICE

(71) Applicants: China Mobile Communication Co., Ltd Research Institute, Beijing (CN); China Mobile Communications Group Co.,Ltd., Beijing (CN)

(72) Inventors: Kai Niu, Beijing (CN); Jinsheng Dai, Beijing (CN); Bolin Wu, Beijing (CN); Sen Wang, Beijing (CN); Yifei Yuan, Beijing (CN)

(73) Assignees: China Mobile Communication Co., Ltd Research Institute, Beijing (CN); China Mobile Communications Group Co., Ltd., Beijing (CN)

( * ) Notice: Subject to any disclaimer, the term of this patent is extended or adjusted under 35 U.S.C. 154(b) by 70 days.

(21) Appl. No.: 18/264,625

(22) PCT Filed: Feb. 10, 2022

(86) PCT No.: PCT/CN2022/075918
§ 371 (c)(1),
(2) Date: Aug. 8, 2023

(87) PCT Pub. No.: WO2022/171183
PCT Pub. Date: Aug. 18, 2022

(65) Prior Publication Data
US 2024/0146334 A1 May 2, 2024

(30) Foreign Application Priority Data
Feb. 10, 2021 (CN) .......................... 202110185324.7

(51) Int. Cl.
*H03M 13/19* (2006.01)
*H03M 13/13* (2006.01)
(Continued)

(52) U.S. Cl.
CPC ........... *H03M 13/19* (2013.01); *H03M 13/13* (2013.01); *H03M 13/251* (2013.01);
(Continued)

(58) Field of Classification Search
CPC .... H03M 13/19; H03M 13/13; H03M 13/251; H03M 13/35; H04L 1/0041; H04L 1/0058; H04L 1/0009
See application file for complete search history.

(56) References Cited

U.S. PATENT DOCUMENTS 11,075,653 B2 * 7/2021 Chen ................. H03M 13/6318
2018/0331783 A1 * 11/2018 Ahn ........................ H04L 27/18
(Continued)

FOREIGN PATENT DOCUMENTS

CN 106982172 A 7/2017
CN 110071779 A 7/2019
(Continued)

OTHER PUBLICATIONS

Dai et al., Progressive Rate-Filling: A Framework for Agile Construction of Multilevel Polar-Coded Modulation, Nov. 20, 2020, arXiv, pp. 1-5. (Year: 2020).*
(Continued)

*Primary Examiner* — John J Tabone, Jr.
(74) *Attorney, Agent, or Firm* — Price Heneveld LLP

(57) ABSTRACT

An information bit determination method and a mapping relationship generation method for polar-coded modulation, and devices thereof are provided. The information bit determination method includes: providing a mapping relationship table for a predefined polar-coded modulation scheme, the
(Continued)

mapping relationship table at least including target rates, modulation orders and first parameters of a polar code/component code under different MCS indices; determining the quantity of information bits in each polar code/component code in a target polar-coded modulation system in accordance with the mapping relationship table; and determining an information bit set corresponding to each polar code/component code in accordance with the quantity of information bits in each polar code/component code in the target polar-coded modulation system, the information bit set being used to indicate a set of positions of the information bits. According to the present application, a mapping relationship generation method and an information bit determination method for polar-coded modulation are provided independent of a channel state, so it is able to improve the flexibility and the practicability of the polar-coded modulation scheme.

17 Claims, 8 Drawing Sheets

(51) Int. Cl.
 *H03M 13/25* (2006.01)
 *H03M 13/35* (2006.01)
 *H04L 1/00* (2006.01)

(52) U.S. Cl.
 CPC .......... *H04L 1/0041* (2013.01); *H04L 1/0058* (2013.01); *H03M 13/35* (2013.01); *H04L 1/0009* (2013.01)

(56) References Cited

U.S. PATENT DOCUMENTS

2020/0067531 A1* 2/2020 Chen .................. H04L 1/0052
2024/0146334 A1* 5/2024 Niu .................... H04L 1/0058

FOREIGN PATENT DOCUMENTS

| | | |
|---|---|---|
| CN | 111385059 A | 7/2020 |
| WO | 2018166256 A1 | 8/2018 |

OTHER PUBLICATIONS

Saha et al., Bit-Interleaved Polar Coded Modulation with Iterative Decoding, 2018, IEEE, pp. 1-8. (Year: 2018).*
Tavildar, Bit-permuted coded modulation for polar codes, 2017, IEEE, pp. 1-6. (Year: 2017).*
Dai et al, "Progressive Rate-Filling: A Framework for Agile Construction of Multilevel Polar-Coded Modulation", arxiv.org, Cornell University Library, 201 Olin Library Cornell University Ithaca, NY 14853, Nov. 20, 2020, XP081818660.

* cited by examiner

INFORMATION BIT DETERMINATION METHOD AND MAPPING GENERATION METHOD FOR POLAR-CODED MODULATION, AND DEVICE

CROSS-REFERENCE TO RELATED APPLICATION

This application is the U.S. national phase of PCT Application No. PCT/CN2022/075918 filed on Feb. 10, 2022, which claims the priority of the Chinese patent application No. 202110185324.7 filed in China on Feb. 10, 2021, which is incorporated herein by reference in its entirety.

TECHNICAL FIELD

The present application relates to the field of mobile communication technology, in particular to an information bit determination method and a mapping generation method for polar-coded modulation, and devices thereof.

BACKGROUND

Polar code, as a channel coding technique which uniquely and theoretically reaches the Shannon limit at the present time and has a practical linear-complexity encoding/decoding capability, has become a strong candidate in channel coding schemes for a $5^{th}$-Generation (5G) mobile communication system. Currently, the $3^{rd}$-Generation Partnership Project (3GPP) has determined the use of the polar code scheme mainly promoted by such companies such Huawei as a control channel coding scheme in a 5G Enhanced Mobile Broadband (eMBB) scenario. The channel coding schemes in the 5G eMBB scenario have been completely determined, and the polar code is used as a coding scheme for a control channel.

A polar-coded modulation scheme is a scheme where coding and modulation are jointly optimized so as to theoretically reach a capacity of a symmetric channel and achieve better performance as compared with a currently-used coding and modulation scheme with a Low Density Parity Check (LDPC) code in the 5G system, so it is one of the strong candidate schemes for the mobile communication system.

A conventional information bit determination method for polar-coded modulation depends on a signal-to-noise ratio, so it is not sufficiently flexible in use. Hence, there is an urgent need to provide a polar-coded modulation scheme independent of a channel state, so as to flexibly determine an information bit set for the polar code/component code, thereby to improve the practicability of the polar-coded modulation scheme.

SUMMARY

At least one embodiment of the present application is to provide an information bit determination method and a mapping generation method for polar-coded modulation, and devices thereof, so as to providing a mapping relationship generation scheme and an information bit determination scheme for polar-coded modulation independent of a channel state, thereby to improve the flexibility and the practicability of the polar-coded modulation scheme.

In one aspect, the present application provides in some embodiments an information bit determination method for polar-coded modulation, including: providing a mapping relationship table for a predefined polar-coded modulation scheme, the mapping relationship table at least including target rates, modulation orders and first parameters of a polar code/component code under different Modulation and Coding Scheme (MCS) indices; determining the quantity of information bits in each polar code/component code in a target polar-coded modulation system in accordance with the mapping relationship table; and determining an information bit set corresponding to each polar code/component code in accordance with the quantity of information bits in each polar code/component code in the target polar-coded modulation system, the information bit set being used to indicate a set of positions of the information bits.

In another aspect, the present application provides in some embodiments a mapping relationship generation method for polar-coded modulation, including: creating a polar-coded modulation system, and initializing parameters of a polar-coded modulation scheme; determining an equivalent channel of the polar-coded modulation system in accordance with target spectrum efficiency of the polar-coded modulation system; and calculating a channel capability for each polar code/component code in accordance with the equivalent channel, and generating a mapping relationship table for the polar-coded modulation scheme, the mapping relationship table at least including target rates, modulation orders and first parameters of a polar code/component code under different MCS indices.

In yet another aspect, the present application provides in some embodiments an information bit determination device for polar-coded modulation, including: an obtaining module configured to provide a mapping relationship table for a predefined polar-coded modulation scheme, the mapping relationship table at least including target rates, modulation orders and first parameters of a polar code/component code under different MCS indices; a first determination module configured to determine the quantity of information bits in each polar code/component code in a target polar-coded modulation system in accordance with the mapping relationship table; and a second determination module configured to determine an information bit set corresponding to each polar code/component code in accordance with the quantity of information bits in each polar code/component code in the target polar-coded modulation system, the information bit set being used to indicate a set of positions of the information bits.

In still yet another aspect, the present application provides in some embodiments a mapping relationship generation device for polar-coded modulation, including: an initialization module configured to create a polar-coded modulation system, and initialize parameters of a polar-coded modulation scheme; a determination module configured to determine an equivalent channel of the polar-coded modulation system in accordance with target spectrum efficiency of the polar-coded modulation system; and a generation module configured to calculate a channel capability for each polar code/component code in accordance with the equivalent channel, and generate a mapping relationship table for the polar-coded modulation scheme, the mapping relationship table at least including target rates, modulation orders and first parameters of a polar code/component code under different MCS indices.

In still yet another aspect, the present application provides in some embodiments a computer-readable storage medium storing therein a program. The program is used to be executed by a processor to implement the above-mentioned methods.

As compared with the prior art, according to the information bit determination method and the mapping generation method for polar-coded modulation, and the devices thereof in the embodiments of the present application, a mapping relationship generation scheme and an information bit determination scheme for polar-coded modulation are provided independent of a channel state, so it is able to improve the flexibility and the practicability of a polar-coded modulation scheme.

BRIEF DESCRIPTION OF THE DRAWINGS

Through reading the detailed description hereinafter, the other advantages and benefits will be apparent to a person skilled in the art. The drawings are merely used to show the preferred embodiments, but shall not be construed as limiting the present application. In addition, in the drawings, same reference symbols represent same members. In these drawings.

DETAILED DESCRIPTION

Figures 1, 2:
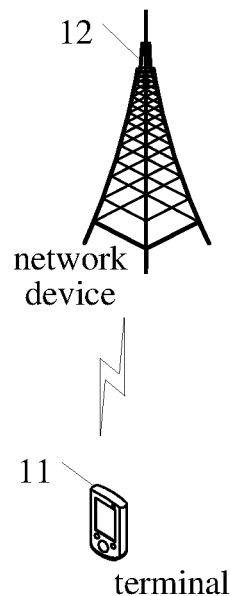
FIG. 1 is a schematic view showing an application scenario according to an embodiment of the present application.
FIG. 2 is a flow chart of an information bit determination method for polar-coded modulation according to an embodiment of the present application.

Exemplary embodiments of the present application will be described in more detail below with reference to the drawings. Although exemplary embodiments of the present application are shown in the drawings, it should be understood that the present application may be embodied in various forms and should not be limited to the embodiments set forth herein. Rather, these embodiments are provided so that the present application can be more thoroughly understood, and the scope of the present application can be fully conveyed to those skilled in the art.

Such words as "first" and "second" involved in the specification and the appended claims are merely used to differentiate different objects rather than to represent any specific order. It should be appreciated that, the data used in this way may be replaced with each other, so as to implement the embodiments in an order other than that shown in the drawings or described in the specification. In addition, such terms as "include" or "including" or any other variations involved in the present application intend to provide non-exclusive coverage, so that a procedure, method, system, product or device including a series of steps or units may also include any other elements not listed herein, or may include any inherent steps or units of the procedure, method, system, product or device. The expression "and/or" in the specification and the appended claims is used to represent at least one of listed objects.

The technology described in the context shall not be limited to a New Radio (NR) system and a Long Term Evolution (LTE)/LTE-Advanced (LTE-A) system, and it may also be applied to various wireless communication systems, e.g., Code Division Multiple Access (CDMA), Time Division Multiple Access (TDMA), Frequency Division Multiple Access (FDMA), Orthogonal Frequency Division Multiple Access (OFDMA), Single-Carrier Frequency-Division Multiple Access (SC-FDMA), or any other system. The terms "system" and "network" may be replaced with each other. The CDMA system may be used to implement such radio technologies as CDMA2000 and Universal Terrestrial Radio Access (UTRA). The UTRA may include Wideband Code Division Multiple Access (WCDMA) and the other CDMA variants. The TDMA system may be used to implement such a radio technology as Global System for Mobile Communication (GSM). The OFDMA system may be used to implement such radio technologies as Ultra Mobile Broadband (UMB), Evolved-UTRA (E-UTRA), IEEE 802.11 (Wireless Fidelity (Wi-Fi)), IEEE 802.16 (WiMAX), IEEE 802.20, and Flash-OFDM. The UTRA and the E-UTRA are parts of a Universal Mobile Telecommunications System (UMTS). The LTE and a more advanced LTE (e.g., LTE-A) are new UMTS versions using the E-UTRA. The UTRA, E-UTRA, UMTS, LTE, LTE-A and GSM have been described in literatures from the $3^{rd}$-Generation Partnership Project (3GPP), and the CDMA 2000 and UMB have been described in literatures from the $3^{rd}$-Generation Partnership Project 2 (3GPP2). The technology described in the context may be applied to the above-mentioned systems and radio technologies, or applied to the other systems and radio technologies. The NR system has been described illustratively hereinafter, and terms for the NR system have been used in most of the description, although these technologies may also be applied to the systems other than the NR system.

The following description is given for illustrative purposes but shall not be construed as limiting the scope, applicability or configuration set forth in the appended claims. Any alterations may be made on functions and arrangements of the discussed elements without departing from the spirit and scope of the present application. Various procedures or assemblies may be omitted, replaced or added appropriately in the examples. For example, steps of the described method may be performed in an order different from that described in the context, and some steps may be added, omitted or combined. In addition, the features described with reference to some examples may be combined in the other examples.

FIG. 1 shows an applicable wireless communication system according to an embodiment of the present application. The wireless communication system includes a terminal 11 and a network device 12. The terminal 11 may also be called as a User Equipment (UE), and it may be a terminal side device such as a mobile phone, a tablet personal computer, a laptop computer, a Personal Digital Assistant (PDA), a Mobile Internet Device (MID), a wearable device or a vehicle-mounted device. It should be appreciated that, the specific type of the terminal 11 will not be repeatedly defined herein. The network device 12 may be a base station and/or a core network network element. The base station may be a $5^{th}$-Generation (5G) base station or a future base station (e.g., gNB, 5G NR NB), or a base station in the other communication system (e.g., eNB, Wireless Local Area Network (WLAN) access point, or any other access point). The base station may be called as node B, evolved node B, access point, Base Transceiver Station (BTS), radio base station, radio transceiver, Basic Service Set (BSS), Extended service Set (ESS), home node B, evolved home node B, WLAN access point, WiFi node or any other appropriate term in the field. The base station shall not be limited to a specific technical term, as long as a same technical effect is achieved. It should be appreciated that, merely the base station in the NR system is taken as an example in the embodiments of the present application, but a specific type of the base station will not be repeatedly defined herein.

The base station may communicate with the terminal 11 under the control of a base station controller. In various examples, the base station controller may be a part of a core network or some base stations. Some base stations may exchange control information or user data with the core network through backhaul. In some examples, some of the base stations may directly or indirectly communicate with each other through a backhaul link, and the backhaul link may be a wired or wireless communication link. The wireless communication system may support operations on a plurality of carriers (waveform signals at different frequencies). A multi-carrier transmitter ma transmit modulated signals on the plurality of carriers simultaneously. For example, each communication link may be a multi-carrier signal modulated using various radio technologies. Each modulated signal may be transmitted on different carriers and may carry control information (e.g., reference signal or control channel), overhead information, data, etc.

The base station may communicate with the terminal 11 in a wireless manner via one or more access points. Each base station may provide a communication coverage at a corresponding coverage region. A coverage region for an access point may be a sector merely constituting a part of the coverage region. The wireless communication system may include various base stations (e.g., macro base station, micro base station, or pico base station). The base station may also use different radio technologies, e.g., cellular or WLAN radio access technology. The base station may be associated with same or different access network or operator deployments. The coverage regions of different base stations (including the coverage regions of the base stations of a same type or different types, the coverage regions using same or different radio technologies, or the coverage regions belonging to same or different access networks) may overlap each other.

A communication link in the wireless communication system may include an uplink for carrying uplink (UL) transmission (e.g., from the terminal 11 to the network device 12), or a downlink for carrying downlink (DL) transmission (e.g., from the network device 12 to the terminal 11). The UL transmission may also be called as reverse link transmission, and the DL transmission may also be called as forward link transmission. The downlink transmission may be performed using a licensed frequency band, a non-licensed frequency band or both. Similarly, the uplink transmission may be performed using the licensed frequency band, the non-licensed frequency band or both.

As mentioned in the Background, a conventional information bit determination scheme base on polar-coded modulation depends on a channel state, resulting in low flexibility and low practicability. An object of the present application is to provide a method for determining an information bit set for a polar code/component code in a PCM scheme, so as to allocate a corresponding code rate in accordance with a channel capacity of each polar code/component code in the PCM scheme, thereby to flexibly determine the information bit set for the polar code/component code independent of the channel state, and improve the practicability of the PCM scheme.

According to the information bit determination method for polar-coded modulation in the embodiments of the present application, the code rate is flexibly allocated while reducing a performance loss as possible. As compared with a conventional method for determining the information bit set for the polar code/component code of the PCM scheme depending on the channel state, the influence on the performance loss may almost be omitted, and the method may be implemented conveniently, so it is particularly suitable for a real communication system, i.e., the practicability is excellent.

In order to achieve the above-mentioned purpose, the present application provides in some embodiments an information bit determination method for polar-coded modulation, which includes: searching for an equivalent channel for achieving reliable transmission in accordance with spectrum efficiency of the transmission; calculating a channel capacity for each component code in the PCM in accordance with the equivalent channel; and allocating an appropriate code rate for the corresponding component code in accordance with the channel capacity for each component code in the PCM.

As shown in FIG. 2, the present application provides in some embodiments an information bit determination method for polar-coded modulation, which includes the following steps.

Step 21: providing a mapping relationship table for a predefined polar-coded modulation scheme, the mapping relationship table at least including target rates, modulation orders and first parameters of a polar code/component code under different MCS indices.

Here, the mapping relationship table for the pre-generated polar-coded modulation scheme is obtained, and the first parameter is a channel capacity, a code rate or the quantity of information bits of the polar code/component code.

Step 22: determining the quantity of information bits in each polar code/component code in a target polar-coded modulation system in accordance with the mapping relationship table.

Step 23: determining an information bit set corresponding to each polar code/component code in accordance with the quantity of information bits in each polar code/component code in the target polar-coded modulation system, the information bit set being used to indicate a set of positions of the information bits.

Here, the information bit set corresponding to the polar code/component code is a set of positions of the information bits of the component code.

According to the embodiments of the present application, as compared with the related art, the information bit set of the polar code/component code is determined independent of a signal-to-noise ratio while reducing a performance loss as possible, so as to improve the flexibility of the scheme. In addition, the method has low complexity, and it is implemented conveniently, so it is particularly suitable for a real communication system, i.e., the practicability is excellent.

To be specific, in the case that the first parameter is the channel capacity of the polar code/component code, Step 22 includes: determining the channel capacity of each polar code/component code in the target polar-coded modulation system in accordance with the mapping relationship table, and allocating a code rate for each polar code/component code in accordance with a ratio of the channel capacity of each polar code/component code in the target polar-coded modulation system to a total channel capacity; and calculating the quantity of information bits, i.e., a set of positions of the information bits, in each polar code/component code in accordance with the code rate for the polar code/component code in the target polar-coded modulation system.

To be specific, in the case that the first parameter is the code rate for the polar code/component code, Step 22 includes: determining a code rate for each polar code/component code in the target polar-coded modulation system in accordance with the mapping relationship table; and calculating the quantity of information bits in each polar code/component code in accordance with the code rate of the polar code/component code in the target polar-coded modulation system.

When calculating the quantity of information bits in each polar code/component code in accordance with the code rate of the polar code/component code in the target polar-coded modulation system, in the embodiments of the present application, the quantity $K_{k_t}$ of information bits allocated for a $(k_t)^{th}$ polar code/component code in the target polar-coded modulation system is calculated in accordance with a code rate $R_{k_t}$ allocated for the $(k_t)^{th}$ polar code/component code through $K_{k_t} = \lceil (K_0 - \Sigma_{t'=1}^{t-1} K_{k_{t'}}) \cdot R_{k_t} \rceil$, where t=1, 2, . . . , $m_0$, $K_0$ represents the quantity of information bits in the target polar-coded modulation system, and the $(k_t)^{th}$ polar code/component code is a $t^{th}$ polar code/component code in a queue of $m_0$ polar codes/component codes in the target polar-coded modulation system ranked in a descending order of channel capacities of binary input equivalent channels corresponding to the polar codes/component codes.

In the embodiments of the present application, when determining the information bit set of the polar code/component code in Step 23, an order of degrees of reliability of the polar codes/component codes each having a symbol length of N is determined in accordance with a polarization sequence obtained in advance (e.g., a fixed sequence in the 5G standard) and a degree of bit sub-channel reliability corresponding to a polar code/component code, to obtain a polar code/component code sequence. The target polar-coded modulation system has a symbol length of N. Then, $K_{k_t}$ polar codes/component codes with a highest degree of reliability are determined in the polar code/component code sequence in accordance with the quantity $K_{k_t}$ of information bits in each polar code/component code in the target polar-coded modulation system, to obtain the information bit set corresponding to each polar code/component code in the target polar-coded modulation system.

A mapping relationship generation method will be described hereinafter.

Figure 3:
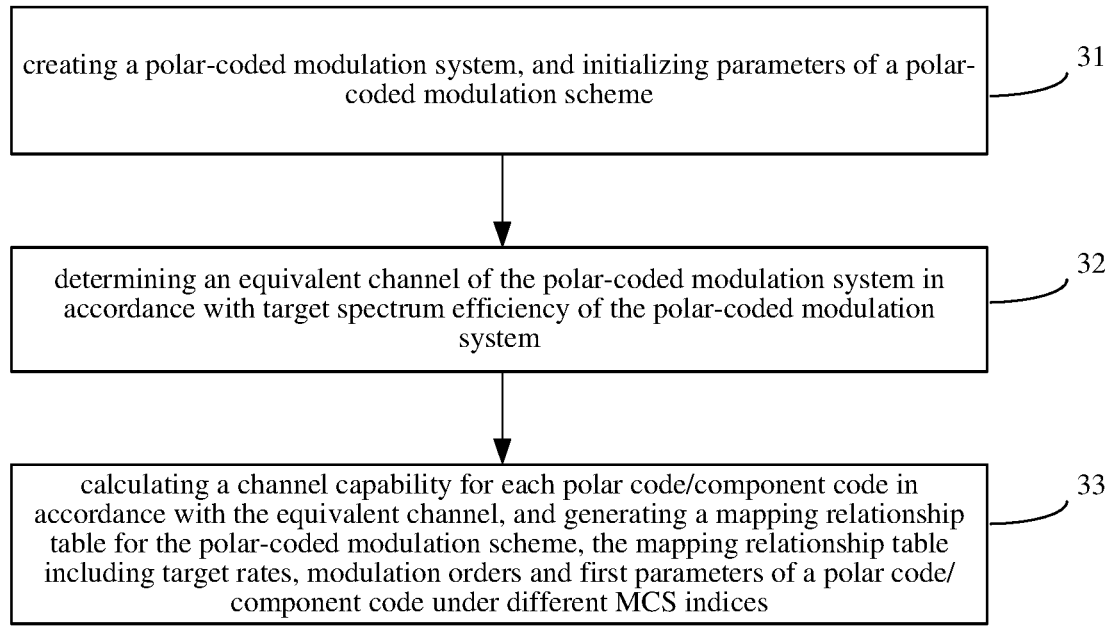
FIG. 3 is a flow chart of a mapping relationship generation method for polar-coded modulation according to an embodiment of the present application.

As shown in FIG. 3, the present application provides in some embodiments a mapping relationship generation method for polar-coded modulation, which includes the following steps.

Step 31: creating a polar-coded modulation system, and initializing parameters of a polar-coded modulation scheme.

Here, in the embodiments of the present application, a PCM system having a code rate of R and a symbol length (a code length) of N and transmitted on a channel W is created. The channel W is divided into m memoryless binary input channels $W_k$, where k=1, 2, . . . , m, and each $W_k$ corresponds to a polar code/component code with a code length of N. Then, K sub-channels with the highest degree of reliability are selected from all of mN polarization sub-channels to carry the information bits. An information bit set of a $k^{th}$ polar code/component code is $A_k$, the quantity K of information bits in the PCM system is $K=\Sigma_{k=1}^{m}|A_k|$, and a code rate R of the PCM system is $$R = \frac{K}{mN}.$$

To be specific, W:X→Y indicates a discrete memoryless channel, where x∈X indicates a modulation symbol with a modulation order of m inputted into the channel W and $|X|=2^m$, y∈Y indicates a symbol outputted by the channel W, and I(X;Y) indicates mutual information between an input and an output of the channel W. For a sequence $b_1^m$ having m bits, a mapping rule of the modulation symbol is expressed as φ:{0,1}$^m$↦X.

Figure 4:
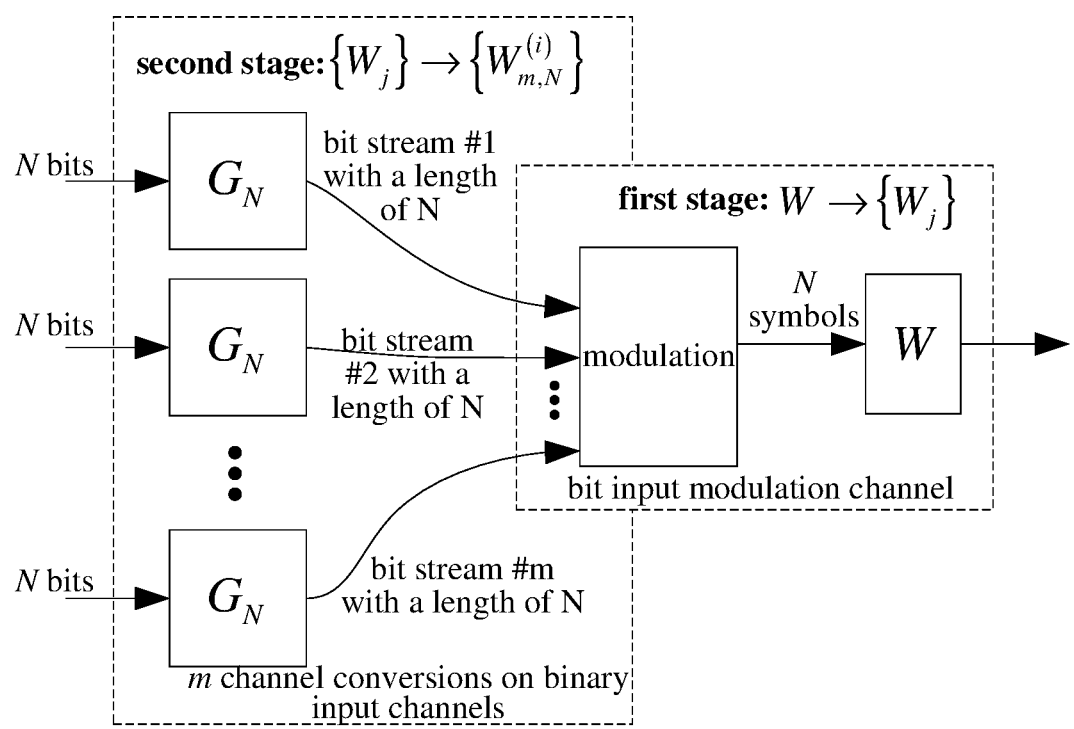
FIG. 4 is a schematic view showing a transmitting end of a Polar-Coded Modulation (PCM) system according to an embodiment of the present application.
Figure 5:
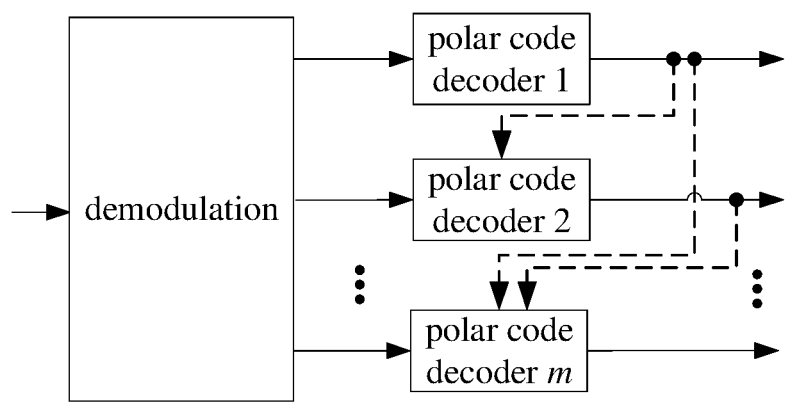
FIG. 5 is a schematic view showing a receiving end of the PCM system according to an embodiment of the present application.

Further, FIG. 4 shows a transmitting end of the PCM system, and FIG. 5 shows a receiving end of the PCM system. As shown in FIG. 4, the channel W is divided into m memoryless binary input channels $W_k$ in accordance with the PCM scheme, where k=1, 2, . . . , m, and each $W_k$ corresponds to a polar code/component code with a code length of N, i.e., $$\varphi: W \to (W_1, W_2, \ldots, W_m) \qquad (1).$$

Hence, a channel transition probability of the channel $W_k$ is $$W_k(y, b_1^{k-1}|b_k) = \frac{1}{2^{m-1}} \sum_{b_{k+1}^{m} \in \{0,1\}^{m-k}} W(y|x = \varphi(b_1^m)). \qquad (2)$$

From the perspective of mutual information, the following equation is obtained:

$$\sum_{k=1}^{m} I(W_k) = \sum_{k=1}^{m} I(B_k; Y|B_1, B_2, \ldots, B_{k-1}) = I(X; Y) = I(W), \qquad (3)$$

where $B_i$ represents a random variable for a bit $b_k$.

In order to create the PCM system having the code rate R and the symbol length of N and transmitted on the channel W, it is necessary to divide the channel W into m memoryless binary input channels $W_k$, where k=1, 2, . . . , m. Each $W_k$ corresponds to a polar code/component code with a code length of N.

Then, for the PCM system, K sub-channels with the highest degree of reliability are selected from all of mN polarization sub-channels to carry the information bits. When an information bit set for a $k^{th}$ polar code/component code is $A_k$, the quantity K of information bits in the PCM system is $K=\Sigma_{k=1}^{m}|A_k|$, and the code rate R is $$R = \frac{K}{mN}.$$

Step 32: determining an equivalent channel of the polar-coded modulation system in accordance with target spectrum efficiency of the polar-coded modulation system.

Here, in the embodiments of the present application, the target spectrum efficiency $R_T$ of the polar-coded modulation system is determined in accordance with a transmission parameter of the polar-coded modulation system, and then the equivalent channel $\overline{W}$ for transmitting the target spectrum efficiency $R_T$ accurately is determined in accordance with the target spectrum efficiency $R_T$ of the polar-coded modulation system. The target spectrum efficiency $R_T$ of the polar-coded modulation system is a product of the quantity m of the binary input channels $W_k$ and the code rate R of the polar-coded modulation system, i.e., $R_T$=mR.

Step 33: calculating a channel capability for each polar code/component code in accordance with the equivalent channel, and generating a mapping relationship table for the polar-coded modulation scheme, the mapping relationship table at least including target rates, modulation orders and first parameters of a polar code/component code under different MCS indices.

In Step 33, the equivalent channel $\overline{W}$ is divided into m memoryless binary input equivalent channels $W_k$, where k=1, 2, ..., m. Here, a channel capacity of the equivalent channel $W_k$ corresponding to each polar code/component code is calculated, so as to generate the mapping relationship table for the polar-coded modulation scheme. The mapping relationship table includes at least one mapping relationship among the target rate, the modulation order and the code rate of each bit sub-channel of the polar-coded modulation system, and an index of the polar-coded modulation scheme is allocated for each mapping relationship.

Through the above steps, the present application provides a scheme for generating the mapping relationship for the polar-coded modulation independent of a channel state. Table 2 is an example of the mapping relationship table, and the code rates of the bit sub-channels are R1 to R4, respectively.

Two implementation modes for determining the equivalent channel and calculating the channel capacity of each component code will be described hereinafter, i.e., a first implementation mode on the basis of the channel capacity and a second implementation mode on the basis of finite-code-length channel capacity.

In the first implementation mode, in Step 32, the target spectrum efficiency of the polar-coded modulation system is determined in accordance with the transmission parameter of the polar-coded modulation system, i.e., $R_T$=mR. Then, an equivalent channel $\overline{W}$ is determined in accordance with the target spectrum efficiency so that $I(\overline{W})$=$R_T$=mR, where $I(\overline{W})$ represents a channel capacity of the equivalent channel $\overline{W}$, and $$I(\overline{W}) = mR = \sum_{x \in X}\sum_{y \in Y} \frac{1}{2^m} \cdot \overline{W}(y|x) \cdot \log_2 \frac{\overline{W}(y|x)}{\sum_{x' \in X} \frac{1}{2^m} \cdot \overline{W}(y|x')}.$$

In the first implementation mode, in Step 33, the equivalent channel $\overline{W}$ is divided into m memoryless binary input equivalent channels $\overline{W}_k$, where k=1, 2, ..., m, and a channel transition probability is $$\overline{W}_k(y, b_1^{k-1}|b_k) = \frac{1}{2^{m-1}} \sum_{b_{k+1}^m \in \{0,1\}^{m-k}} \overline{W}(y|x = \varphi(b_1^m)).$$

Next, the channel capacity $I(\overline{W}_k)$ of the equivalent channel $\overline{W}_k$ is calculated in accordance with the channel transition probability of the equivalent channel $\overline{W}_k$. Then, the mapping relationships for the polar-coded modulation system are created in accordance with the target spectrum efficiency of the polar-coded modulation system and the channel capacity of each equivalent channel, and a corresponding index is allocated for each mapping relationship, to obtain the mapping relationship table for the polar-coded modulation scheme.

In the second implementation mode, in Step 32, the target spectrum efficiency of the polar-coded modulation system is determined, i.e., $R_T$=mR. Next, an equivalent channel $\overline{W}$ is determined in accordance with the target spectrum efficiency, so that $M(\overline{W},N,\epsilon)$=$R_T$=mR, where $M(\overline{W},N,\epsilon)$ represents a finite-code-length channel capacity of the equivalent channel $\overline{W}$, N represents a symbol length, $\epsilon$ represents an error probability of the polar-coded modulation system, $$M(\overline{W}, N, \epsilon) = \sum_{k=1}^{m} M(\overline{W}_k, N, \epsilon_k),$$

$\overline{W}_k$ represents a binary input equivalent channel of a $k^{th}$ polar code/component code, $\epsilon_k$ represents an error probability of the equivalent channel $\overline{W}_k$, $$\epsilon_k = 1 - (1-\epsilon)^{\frac{1}{m}}, M(\overline{W}_k, N, \epsilon_k) = I(\overline{W}_k) - \sqrt{\frac{V_k}{N}} Q^{-1}(\epsilon_k),$$

$Q(\bullet)$ is a complementary Gaussian cumulative distribution function, $V_k$ is channel divergence of the equivalent channel, and $$V_k = \sum_{b_1^k \in \{0,1\}^k} \sum_{y \in Y} \frac{Pr(y|b_1^k)}{2^k} \cdot \left[\log_2 \frac{Pr(y|b_1^k)}{Pr(y|b_1^{k-1})}\right]^2 - I^2(\overline{W}_k).$$

In the second implementation mode 2, in Step 33, the equivalent channel $\overline{W}$ is divided into m memoryless binary input equivalent channels $\overline{W}_k$, where k=1, 2, ..., m, and a channel transition probability is $$\overline{W}_k(y, b_1^{k-1}|b_k) = \frac{1}{2^{m-1}} \sum_{b_{k+1}^m \in \{0,1\}^{m-k}} \overline{W}(y|x = \varphi(b_1^m)).$$

Next, a finite-code-length channel capacity of the equivalent channel $\overline{W}_k$ is calculated in accordance with the channel transition probability, the symbol length N and the error probability $\epsilon_k$ of the equivalent channel $\overline{W}_k$, i.e., $$M(\overline{W}_k, N, \epsilon_k) = I(\overline{W}_k) - \sqrt{\frac{V_k}{N}} Q^{-1}(\epsilon_k).$$

Then, the mapping relationships for the polar-coded modulation system are created in accordance with the target spectrum efficiency of the polar-coded modulation system and the channel capacity of each equivalent channel, and an index is allocated for each mapping relationship, to obtain the mapping relationship table for the polar-coded modulation scheme.

Here, in the mapping relationship, the target rate of the polar-coded modulation system is the target spectrum efficiency of the polar-coded modulation system.

Here, in the mapping relationship, when the first parameter is the channel capacity of the polar code/component code, the channel capacity of each equivalent channel is taken as the channel capacity of the corresponding polar code/component code; when the first parameter is the code rate of the polar code/component code, the code rate allocated for each polar code/component code is determined in accordance with a ratio of the channel capacity of each polar code/component code in the polar-coded modulation system to a total channel capacity; and when the first parameter is the quantity of information bits in the polar code/component code, the code rate allocated for each polar code/component code is determined in accordance with the ratio of the channel capacity of each polar code/component code in the polar-coded modulation system to the total channel capacity, and the quantity of information bits in each polar code/component code is determined in accordance with the code rate of the polar code/component code in the polar-coded modulation system.

For example, in the first implementation mode, in Step 33, the m memoryless binary input equivalent channels $\overline{W}_k$ are ranked so that $I(\overline{W}_{k_1}) \geq I(\overline{W}_{k_2}) \geq \ldots \geq I(\overline{W}_{k_m})$, and then a code rate $R_{k_t}$ allocated for a $(k_t)^{th}$ polar code/component code is calculated through $$R_{k_t} = \frac{I(\overline{W}_{k_t})}{\sum_{t'=t}^{m} I(\overline{W}_{k_{t'}})}.$$

In the second implementation mode, in Step 33, the m memoryless binary input equivalent channels $\overline{W}_k$ are ranked so that $M(\overline{W}_{k_1}, N, \epsilon_{k_1}) \geq M(\overline{W}_{k_2}, N, \epsilon_{k_2}) \geq \ldots \geq M(\overline{W}_{k_m}, N, \epsilon_{k_m})$, and then the code rate $R_{k_t}$ allocated for the $(k_t)^{th}$ polar code/component code is calculated through $$R_{k_t} = \frac{M(\overline{W}_{k_t}, N, \epsilon_{k_t})}{\sum_{t'=t}^{m} M(\overline{W}_{k_{t'}}, N, \epsilon_{k_{t'}})}.$$

It should be appreciated that, in the information bit determination method for polar-coded modulation, similar to those mentioned in the mapping relationship generation method, the target polar-coded modulation system is initialized and the channel is divided into a plurality of channels, and then the first parameter corresponding to each polar code/component code is determined through looking up the mapping relationship table, which will not be further defined herein.

The two implementation modes for determining the equivalent channel and calculating the channel capacity of each component code, i.e., the first implementation mode on the basis of the channel capacity and the second implementation mode on the basis of the finite-code-length channel capacity, will be further described hereinafter in conjunction with FIGS. 6 and 7.

First Implementation Mode

Figure 6:
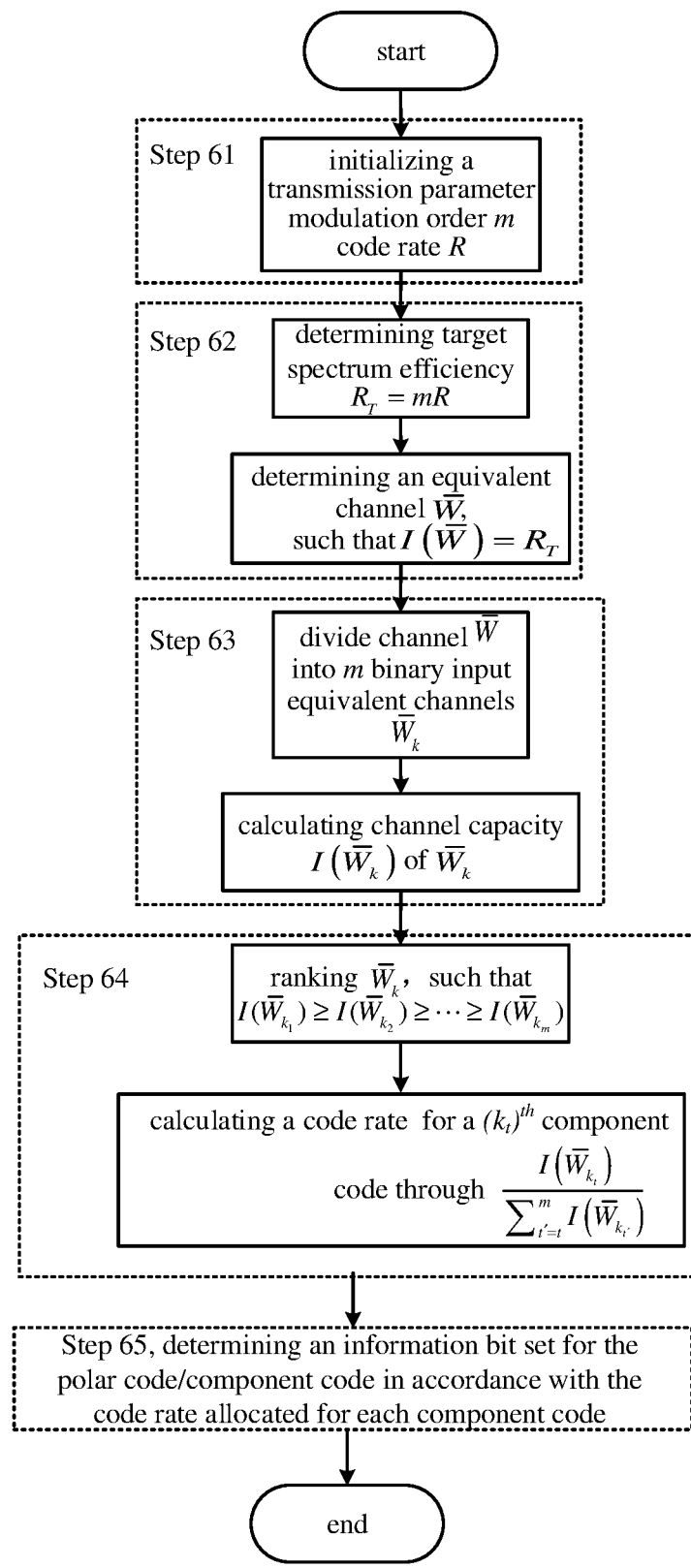
FIG. 6 is another flow chart of the information bit determination method for polar-coded modulation according to an embodiment of the present application.

As shown in FIG. 6, the information bit determination method for polar-coded modulation specifically includes the following steps.

Step 61: initializing parameters of the polar-coded modulation scheme.

To be specific, W:X→Y indicates a discrete memoryless channel, where x∈X indicates a modulation symbol with a modulation order of m inputted into the channel W and $|X|=2^m$, y∈Y indicates a symbol outputted by the channel W, and I(X;Y) indicates mutual information between an input and an output of the channel W. For a sequence $b_1^m$ having m bits, a mapping rule of the modulation symbol is expressed as $\varphi:\{0,1\}^m \mapsto X$.

The channel W is divided into m memoryless binary input channels $W_k$ in accordance with the PCM scheme, where k=1, 2, ..., m, i.e., $$\varphi:W \to (W_1, W_2, \ldots, W_m) \quad (4).$$

A channel transition probability of the channel $W_k$ is $$W_k(y, b_1^{k-1} | b_k) = \frac{1}{2^{m-1}} \sum_{b_{k+1}^m \in \{0,1\}^{m-k}} W(y | x = \varphi(b_1^m)). \quad (5)$$

In addition, from the perspective of mutual information, the following equation is obtained:

$$\sum_{k=1}^{m} I(W_k) = \sum_{k=1}^{m} I(B_k; Y | B_1, B_2, \ldots, B_{k-1}) = I(X; Y) = I(W). \quad (6)$$

In order to create the PCM system having the code rate R and the symbol length of N and transmitted on the channel W, it is necessary to divide the channel W into m memoryless binary input channels $W_k$, where k=1, 2, ..., m. Each $W_k$ corresponds to a polar code/component code with a code length of N.

For the PCM system, K sub-channels with the highest degree of reliability are selected from all of mN polarization sub-channels to carry the information bits. When an information bit set for a $k^{th}$ polar code/component code is $A_k$, the quantity K of information bits in the PCM system is $K = \sum_{k=1}^{m} |A_k|$, and the code rate R is $$R = \frac{K}{mN}.$$

Step 62: determining a corresponding equivalent channel in accordance with the target spectrum efficiency of the transmission.

Here, the target spectrum efficiency of the PCM system is determined through $R_T = mR$, to obtain the equivalent channel $\overline{W}$ for transmitting the target spectrum efficiency accurately. To be specific, (a) the target spectrum efficiency is determined in accordance with the transmission parameter of the PCM system, i.e., $R_T = mR$, and then the equivalent channel $\overline{W}$ for transmitting the target spectrum efficiency accurately is determined in accordance with $R_T$. In the first implementation mode, the equivalent channel is obtained in accordance with the channel capacity. (b) When obtaining the equivalent channel in accordance with the channel capacity, an equivalent channel $\overline{W}$ is determined in accordance with $R_T$, so that $I(\overline{W}) = R_T = mR$, where $I(\overline{W})$ represents the channel capacity of the channel $\overline{W}$, and $$I(\overline{W}) = mR = \sum_{x \in X} \sum_{y \in Y} \frac{1}{2^m} \cdot \overline{W}(y|x) \cdot \log_2 \frac{\overline{W}(y|x)}{\sum_{x' \in x} \frac{1}{2^m} \cdot \overline{W}(y|x')}. \quad (7)$$

Step 63: calculating a channel capacity of each polar code/component code in the PCM in accordance with the equivalent channel.

Here, the equivalent channel $\overline{W}$ is divided into m memoryless binary input equivalent channels $\overline{W}_k$ using the above-mentioned channel dividing mode, where k=1, 2, ..., m, and then the channel capacity of each $\overline{W}_k$ is calculated. The equivalent channel is obtained in accordance with the channel capacity. To be specific, the equivalent channel $\overline{W}$ is divided into m memoryless binary input equivalent channels $\overline{W}_k$, and a channel transition probability $\overline{W}_k(y, b_1^{k-1}|b_k)$ of $\overline{W}_k$ is calculated through $$\overline{W}_k(y, b_1^{k-1}|b_k) = \frac{1}{2^{m-1}} \sum_{b_{k+1}^m \in \{0,1\}^{m-k}} \overline{W}(y|x = \varphi(b_1^m)). \quad (8)$$

Then, the channel capacity $I(\overline{W}_k)$ is calculated in accordance with the channel transition probability of $\overline{W}_k$.

For example, the channel capacity is calculated through $$I(\overline{W}_k) = \sum_{b_1^k \in \{0,1\}^k} \sum_{y \in Y} \frac{Pr(y|b_1^k)}{2^k} \cdot \log_2 \frac{Pr(y|b_1^k)}{Pr(y|b_1^{k-1})},$$

where $$Pr(y|b_1^k) = \frac{1}{2^{m-k}} \sum_{b_{k+1}^m \in \{0,1\}^{m-k}} \overline{W}(y|x = \varphi(b_1^m)).$$

Step 64: allocating an appropriate code rate for a corresponding polar code/component code in accordance with the channel capacity for each component code in the PCM.

Here, the code rate is allocated for a corresponding polar code/component code the in accordance with the channel capacity equivalence, i.e., the appropriate code rate is allocated for the corresponding polar code/component code in accordance with the channel capacity of each $\overline{W}_k$. To be specific, the m memoryless binary input equivalent channels $\overline{W}_k$ are ranked so that $$I(\overline{W}_{k_1}) \geq I(\overline{W}_{k_2}) \geq \ldots \geq I(\overline{W}_{k_m}) \quad (9),$$

and then the code rate $R_{k_t}$ k allocated for the $(k_t)^{th}$ polar code/component code is calculated through $$R_{k_t} = \frac{I(\overline{W}_{k_t})}{\sum_{t'=t}^{m} I(\overline{W}_{k_{t'}})}.$$

Step 65: determining the information bit set in accordance with the code rate of the polar code/component code allocated for each polar code/component code.

Here, positions of information bits in each component code are selected in accordance with the code rate allocated for each component code and degrees of reliability of the polar codes, so as to determine the information bit set for the polar code/component code. To be specific, the quantity $K_{k_t}$ of information bits allocated for the $(k_t)^{th}$ polar code/component code is calculated in accordance with the code rate $R_{k_t}$ allocated for the $(k_t)^{th}$ polar code/component code through $K_{k_t} = \lceil (K - \Sigma_{t'=1}^{t-1} K_{k_{t'}}) \cdot R_{k_t} \rceil$, where t=1, 2, ..., m.

To be specific, for t=1, 2, ..., m, the quantity of information bits allocated for a $k^{th}$ polar code/component code is calculated through $$K_{k_t} = \left\lceil \left(K - \sum_{t'=1}^{t-1} K_{k_{t'}}\right) \cdot \frac{I(\overline{W}_{k_t})}{\sum_{t'=t}^{m} I(\overline{W}_{k_{t'}})} \right\rceil. \quad (10)$$

In the above equations, when t=1, a sum term is omitted.

Then, the information bit set $A_{k_t}$ is determined in accordance with a fixed sequence (e.g., a sequence in the 5G standard) and $K_{k_t}$. To be specific, the degrees of reliability of the polar codes/component codes with a symbol length of N are ranked in accordance with a polarization sequence obtained in advance and a degree of reliability of a bit sub-channel thereof (e.g., the sequence in the 5G standard in Table 1), and then $K_{k_t}$ polar codes/component codes with a highest degree of reliability are selected. Next, the information bit set corresponding to the $K_{k_t}$ polar codes/component codes with the highest degree of reliability is determined in accordance with the quantity of information bits in each polar code/component code.

Table 1 shows an order of degrees of reliability of the polar codes used in the 5G NR. It should be appreciated that, the present application is not limited to the order of the degrees of reliability of the polar codes in the 5G NR, and any other order of degrees of polar codes, e.g., a PW order, is also suitable for the present application. The order in Table 1 is for illustrative purposes only. How to determine the information bit set for the polar code/component code will be described hereinafter in accordance with Table 1. Table 2 is an MCS mapping relationship table in actual use.

After determining the code rate of each polar code/component code and the quantity $K_i$ of corresponding information bits in the PCM system (i=1, 2, ..., m), an order of degrees of reliability of the polarization sub-channels is determined in accordance with the code length N of each component code and the polarization sequences in Table 1. To be specific, taking the polarization sequence in Table 1 as an example, the bit sub-channels in a polarization sequence $Q_0^{N_{max}-1} = \{Q_0^{N_{max}}, Q_1^{N_{max}}, \ldots, Q_{N_{max}-1}^{N_{max}}\}$ are ranked in an ascending order of the degrees of reliability of the bit sub-channels, i.e., $W(Q_0^{N_{max}}) < W(Q_1^{N_{max}}) < \ldots < W(Q_{N_{max}-1}^{N_{max}})$, where $W(Q_i^{N_{max}})$ represents a degree of reliability of a $(Q_1^{N_{max}})^{th}$ bit sub-channel. For the polar codes with a code length of N, a polarization sequence $Q_0^{N-1} = \{Q_0^N, Q_1^N, Q_2^N, \ldots, Q_{N-1}^N\} = \{Q_i^{N_{max}} | Q_i^{N_{max}} < N\} \in Q_0^{N_{max}-1}$ is also obtained, so the degrees of reliability of the bit sub-channels in the polarization sequence are ranked as $W(Q_0^N) < W(Q_1^N) < W(Q_2^N) < \ldots < W(Q_{N-1}^N)$.

Then, the corresponding information bit set A is determined in accordance with the quantity $K_i$ (i=1, 2, ..., m) of information bits in each component code in the PCM system and the polarization sequence $Q_0^{N-1}$. To be specific, $A_i = \{Q_j^N | j \geq N - K_i\}$.

Second Implementation Mode

Figure 7:
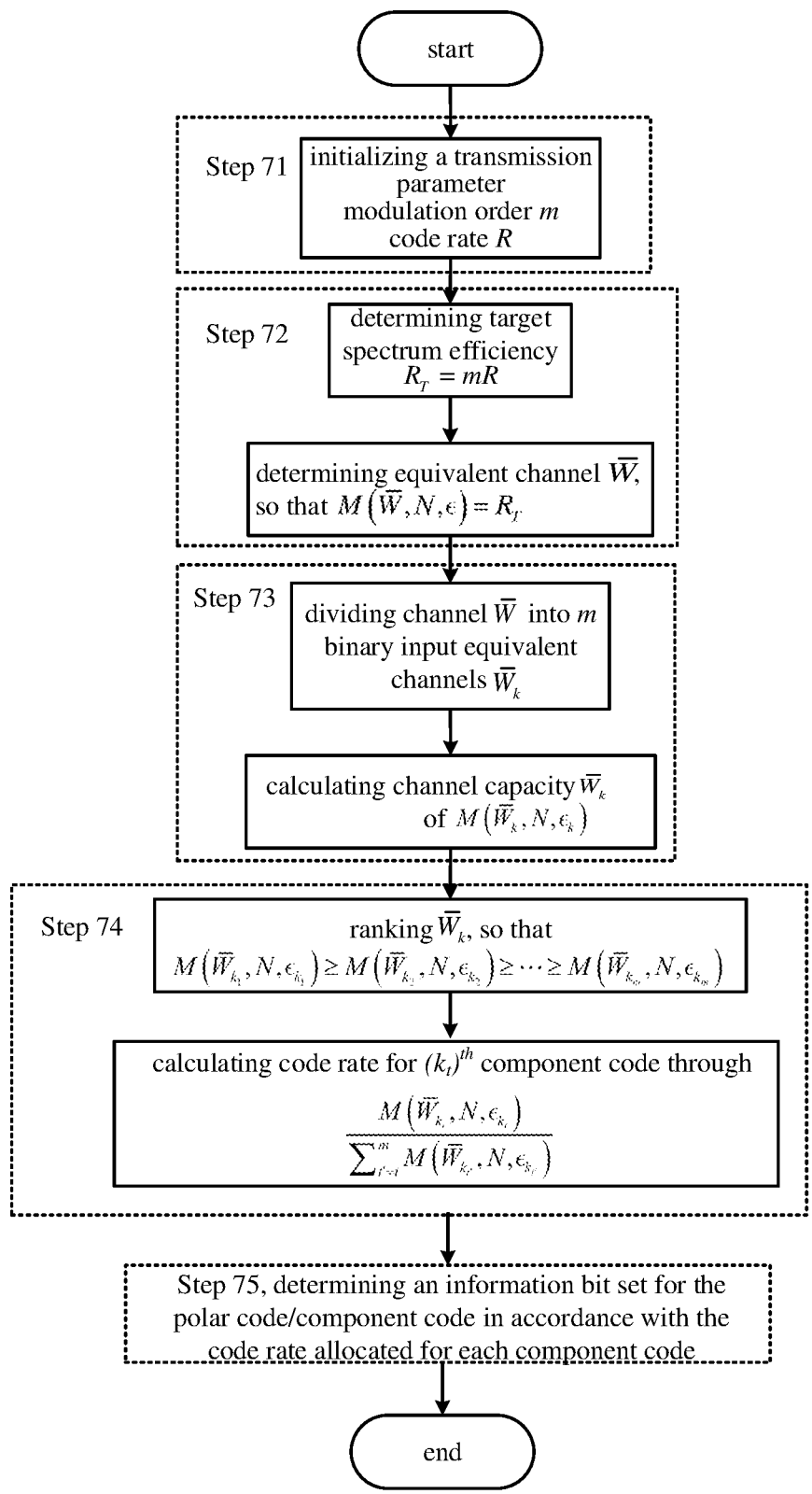
FIG. 7 is yet another flow chart of the information bit determination method for polar-coded modulation according to an embodiment of the present application.

As shown in FIG. 7, the information bit determination method for polar-coded modulation specifically includes the following steps.

Step 71: initializing parameters of the polar-coded modulation scheme.

Here, a PCM system having a code rate of R and a symbol length of N and transmitted on a channel W is created. An information bit set for a $k^{th}$ polar code/component code is $A_k$, the quantity of information bits is $K=\Sigma_{k=1}^{m}|A_k|$, and a code rate is $$R = \frac{K}{mN}.$$

Step 71 may refer to Step 61, and thus will not be repeatedly defined herein.

Step 72: determining a corresponding equivalent channel in accordance with the transmitted target spectrum efficiency.

Here, the target spectrum efficiency of the PCM system is determined through $R_T=mR$, to obtain the equivalent channel $\overline{W}$ for transmitting the target spectrum efficiency accurately. To be specific, (a) the target spectrum efficiency is determined in accordance with the transmission parameter of the PCM system, i.e., $R_T=mR$. (b) The equivalent channel $\overline{W}$ for transmitting the target spectrum efficiency accurately is determined in accordance with $R_T$. In the second implementation mode, the equivalent channel is obtained in accordance with the finite-code-length channel capacity. (c) When the equivalent channel is obtained in accordance with the finite-code-length channel capacity, an equivalent channel $\overline{W}$ is determined in accordance with $R_T$, so that $M(\overline{W},N,\epsilon)=R_T=mR$, where $M(\overline{W},N,\epsilon)$ represents the finite-code-length channel capacity of the channel $\overline{W}$, N represents the symbol length, and $\epsilon$ represents the error probability of the PCM system. $M(\overline{W},N,\epsilon)$ is calculated through $$M(\overline{W}, N, \epsilon) = \sum_{k=1}^{m} M(\overline{W}_k, N, \epsilon_k), \quad (11)$$

where $\overline{W}_k$ represents the binary input equivalent channel for the $k^{th}$ polar code/component code, $\epsilon_k$ represents the error probability of the equivalent channel $$\overline{W}_k, \text{ and } \epsilon_k = 1 - (1-\epsilon)^{\frac{1}{m}}. \quad (12)$$

Further, $$M(\overline{W}_k, N, \epsilon_k) = I(\overline{W}_k) - \sqrt{\frac{V_k}{N}} Q^{-1}(\epsilon_k),$$

where $Q(\cdot)$ is a complementary Gaussian cumulative distribution function, $V_k$ is channel divergence of the equivalent channel, and $$V_k = \sum_{b_1^k \in \{0,1\}^k} \sum_{y \in Y} \frac{Pr(y|b_1^k)}{2^k} \cdot \left[\log_2 \frac{Pr(y|b_1^k)}{Pr(y|b_1^{k-1})}\right]^2 - I^2(\overline{W}_k). \quad (13)$$

Step 73: calculating the channel capacity of each polar code/component code in the PCM system in accordance with the equivalent channel.

Here, the equivalent channel $\overline{W}$ is divided into m memoryless binary input equivalent channels $\overline{W}_k$ like that in Step 71, where k=1, 2, . . . , m, and then the channel capacity of each $\overline{W}_k$ is calculated. To be specific, when the equivalent channel is obtained in accordance with the finite-code-length channel capacity, the equivalent channel $\overline{W}$ is divided into m memoryless binary input equivalent channels $\overline{W}_k$, and a channel transition probability of the equivalent channel $\overline{W}_k$ is $$\overline{W}_k(y, b_1^{k-1}|b_k) = \frac{1}{2^{m-1}} \sum_{b_{k+1}^m \in \{0,1\}^{m-k}} \overline{W}(y|x = \varphi(b_1^m)). \quad (14)$$

Then, the finite-code-length channel capacity is calculated in accordance with the channel transition probability of $\overline{W}_k$, the code length N and the error probability $\epsilon_k$ through $$M(\overline{W}_k, N, \epsilon_k) = I(\overline{W}_k) - \sqrt{\frac{V_k}{N}} Q^{-1}(\epsilon_k). \quad (15)$$

Step 74: allocating an appropriate code rate for a corresponding polar code/component code in accordance with the channel capacity for each component code in the PCM system.

Here, the code rate is allocated in accordance with the finite-code-length channel capacity, i.e., the appropriate code rate is allocated for the corresponding polar code/component code in accordance with the channel capacity of each $\overline{W}_k$. To be specific, the m memoryless binary input equivalent channels $\overline{W}_k$ are ranked so that $$M(\overline{W}_{k_1},N,\epsilon_{k_1}) \geq M(\overline{W}_{k_2},N,\epsilon_{k_2}) \geq \ldots \geq M(\overline{W}_{k_m},N,\epsilon_{k_m}) \quad (16).$$

Then, the code rate $R_{k_t}$ allocated for the $(k_t)^{th}$ polar code/component code is calculated through $$R_{k_t} = \frac{M(\overline{W}_{k_t}, N, \epsilon_{k_t})}{\sum_{t'=t}^{m} M(\overline{W}_{k_{t'}}, N, \epsilon_{k_{t'}})}.$$

Step 75: determining the information bit set for the polar code/component code in accordance with the code rate allocated for each polar code/component code.

Here, positions of information bits in each component code are selected in accordance with the code rate allocated for each component code and degrees of reliability of the polar codes, so as to determine the information bit set for the polar code/component code. To be specific, the quantity $K_{k_t}$ of information bits allocated for the $(k_t)^{th}$ polar code/component code is calculated in accordance with the code rate $R_{k_t}$ allocated for the $(k_t)^{th}$ polar code/component code through $K_{k_t} = \lceil (K-\Sigma_{t'=1}^{t-1} K_{k_{t'}}) \cdot R_{k_t} \rceil$, where t=1, 2, . . . , m.

To be specific, for t=1, 2, . . . , m, the quantity of information bits allocated for a $k^{th}$ polar code/component code is calculated through $$K_{k_t} = \left\lceil \left(K - \sum_{t'=1}^{t-1} K_{k_{t'}}\right) \cdot \frac{M(\overline{W}_{k_t}, N, \epsilon_{k_t})}{\sum_{t'=t}^{m} M(\overline{W}_{k_{t'}}, N, \epsilon_{k_{t'}})} \right\rceil. \quad (17)$$

Then, the information bit set $A_{k_t}$ is determined in accordance with a fixed sequence (e.g., a sequence in the 5G standard) and $K_{k_t}$. To be specific, the degrees of reliability of the polar codes/component codes with a symbol length of N are ranked in accordance with a polarization sequence obtained in advance and a degree of reliability of a bit sub-channel (e.g., the sequence in the 5G standard in Table 1), and then $K_{k_t}$ polar codes/component codes with a highest degree of reliability are selected. Next, the information bit set corresponding to the $K_{k_t}$ polar codes/component codes with the highest degree of reliability is determined in accordance with the quantity of information bits in each polar code/component code.

After determining the code rate of each polar code/component code and the quantity $K_i$ of corresponding information bits in the PCM system (i=1, 2, . . . , m), an order of degrees of reliability of the polarization sub-channels is determined in accordance with the code length N of each component code and the polarization sequences in Table 1. To be specific, taking the polarization sequence in Table 1 as an example, the bit sub-channels in a polarization sequence $Q_0^{N_{max}-1} = \{Q_0^{N_{max}}, Q_1^{N_{max}}, \ldots, Q_{N_{max}-1}^{N_{max}}\}$ are ranked in an ascending order of the degrees of reliability of the bit sub-channels, i.e., $W(Q_0^{N_{max}}) < W(Q_1^{N_{max}}) < \ldots < W(Q_{N_{max}-1}^{N_{max}})$, where $W(Q_i^{N_{max}})$ represents a degree of reliability of a $(Q_i^{N_{max}})^{th}$ bit sub-channel. For the polar code with a code length of N, a polarization sequence $Q_0^{N-1} = \{Q_0^N, Q_1^N, Q_2^N, \ldots, Q_{N-1}^N\} = \{Q_i^{N_{max}} | Q_i^{N_{max}} < N\} \in Q_0^{N_{max}-1}$ is also obtained, so the degrees of reliability of the bit sub-channels in the polarization sequence are ranked as $W(Q_0^N) < W(Q_1^N) < W(Q_2^N) < \ldots < W(Q_{N-1}^N)$.

Then, the corresponding information bit set $A_i$ is determined in accordance with the quantity $K_i$ (i=1, 2, . . . , m) of information bits in each component code in the PCM system and the polarization sequence $Q_0^{N-1}$, i.e., $A_i = \{Q_j^N | j \geq N - K_i\}$.

Table 2 shows code rate allocation results of the first implementation mode based on the channel capacity under 16-bit Cyclic Redundancy Check (CRC) and different MCSs. The modulation order is used to indicate a specific modulation mode. For example, the modulation orders 2, 4 and 6 indicate a Quadrature Phase Shift Keying (QPSK) mode, a 16 Quadrature Amplitude Modulation (QAM) mode and a 64 QAM mode, respectively.

In the first implementation mode, the information bit set for each component code in the PCM system is directly obtained through the above-mentioned method in accordance with Table 2. At first, the code rate of each component code in the PCM system and the quantity of corresponding information bits need to be determined, and then the information bit set for each component code in the PCM system is obtained through the above-mentioned method. When an MCS index is 5, a modulation mode is 16 QAM and the quantity of symbols is 256, a PCM structure is formed by two component codes each having a length of 512 in the polar-coded modulation because In-phase and Quadrature (I/Q) signals are independent of each other and each signal indicates two bits in the 16 QAM. Next, through looking up in Table 2, a capacity (code rate) of a first component code (bit channel 1) is 0.125 and a capacity (code rate) of a second component code (bit channel 2) is 0.6445, so the quantity of information bits is 512*(0.125+0.6445)=394.

TABLE 1

| $W(Q_i^{N_{max}})$ | $Q_i^{N_{max}}$ | $W(Q_i^{N_{max}})$ | $Q_i^{N_{max}}$ | $W(Q_i^{N_{max}})$ | $Q_i^{N_{max}}$ | $W(Q_i^{N_{max}})$ | $Q_i^{N_{max}}$ |
|---|---|---|---|---|---|---|---|
| 0 | 0 | 128 | 518 | 256 | 94 | 384 | 214 |
| 1 | 1 | 129 | 54 | 257 | 204 | 385 | 309 |
| 2 | 2 | 130 | 83 | 258 | 298 | 386 | 188 |
| 3 | 4 | 131 | 57 | 259 | 400 | 387 | 449 |
| 4 | 8 | 132 | 521 | 260 | 608 | 388 | 217 |
| 5 | 16 | 133 | 112 | 261 | 352 | 389 | 408 |
| 6 | 32 | 134 | 135 | 262 | 325 | 390 | 609 |
| 7 | 3 | 135 | 78 | 263 | 533 | 391 | 596 |
| 8 | 5 | 136 | 289 | 264 | 155 | 392 | 551 |
| 9 | 64 | 137 | 194 | 265 | 210 | 393 | 650 |
| 10 | 9 | 138 | 85 | 266 | 305 | 394 | 229 |
| 11 | 6 | 139 | 276 | 267 | 547 | 395 | 159 |
| 12 | 17 | 140 | 522 | 268 | 300 | 396 | 420 |
| 13 | 10 | 141 | 58 | 269 | 109 | 397 | 310 |
| 14 | 18 | 142 | 168 | 270 | 184 | 398 | 541 |
| 15 | 128 | 143 | 139 | 271 | 534 | 399 | 773 |
| 16 | 12 | 144 | 99 | 272 | 537 | 400 | 610 |
| 17 | 33 | 145 | 86 | 273 | 115 | 401 | 657 |
| 18 | 65 | 146 | 60 | 274 | 167 | 402 | 333 |
| 19 | 20 | 147 | 280 | 275 | 225 | 403 | 119 |
| 20 | 256 | 148 | 89 | 276 | 326 | 404 | 600 |
| 21 | 34 | 149 | 290 | 277 | 306 | 405 | 339 |
| 22 | 24 | 150 | 529 | 278 | 772 | 406 | 218 |
| 23 | 36 | 151 | 524 | 279 | 157 | 407 | 368 |
| 24 | 7 | 152 | 196 | 280 | 656 | 408 | 652 |
| 25 | 129 | 153 | 141 | 281 | 329 | 409 | 230 |
| 26 | 66 | 154 | 101 | 282 | 110 | 410 | 391 |
| 27 | 512 | 155 | 147 | 283 | 117 | 411 | 313 |
| 28 | 11 | 156 | 176 | 284 | 212 | 412 | 450 |
| 29 | 40 | 157 | 142 | 285 | 171 | 413 | 542 |
| 30 | 68 | 158 | 530 | 286 | 776 | 414 | 334 |
| 31 | 130 | 159 | 321 | 287 | 330 | 415 | 233 |
| 32 | 19 | 160 | 31 | 288 | 226 | 416 | 555 |
| 33 | 13 | 161 | 200 | 289 | 549 | 417 | 774 |
| 34 | 48 | 162 | 90 | 290 | 538 | 418 | 175 |
| 35 | 14 | 163 | 545 | 291 | 387 | 419 | 123 |
| 36 | 72 | 164 | 292 | 292 | 308 | 420 | 658 |
| 37 | 257 | 165 | 322 | 293 | 216 | 421 | 612 |
| 38 | 21 | 166 | 532 | 294 | 416 | 422 | 341 |
| 39 | 132 | 167 | 263 | 295 | 271 | 423 | 777 |
| 40 | 35 | 168 | 149 | 296 | 279 | 424 | 220 |
| 41 | 258 | 169 | 102 | 297 | 158 | 425 | 314 |

TABLE 1-continued

| $W(Q_i^{Nmax})$ | $Q_i^{Nmax}$ | $W(Q_i^{Nmax})$ | $Q_i^{Nmax}$ | $W(Q_i^{Nmax})$ | $Q_i^{Nmax}$ | $W(Q_i^{Nmax})$ | $Q_i^{Nmax}$ |
|---|---|---|---|---|---|---|---|
| 42 | 26 | 170 | 105 | 298 | 337 | 426 | 424 |
| 43 | 513 | 171 | 304 | 299 | 550 | 427 | 395 |
| 44 | 80 | 172 | 296 | 300 | 672 | 428 | 673 |
| 45 | 37 | 173 | 163 | 301 | 118 | 429 | 583 |
| 46 | 25 | 174 | 92 | 302 | 332 | 430 | 355 |
| 47 | 22 | 175 | 47 | 303 | 579 | 431 | 287 |
| 48 | 136 | 176 | 267 | 304 | 540 | 432 | 183 |
| 49 | 260 | 177 | 385 | 305 | 389 | 433 | 234 |
| 50 | 264 | 178 | 546 | 306 | 173 | 434 | 125 |
| 51 | 38 | 179 | 324 | 307 | 121 | 435 | 557 |
| 52 | 514 | 180 | 208 | 308 | 553 | 436 | 660 |
| 53 | 96 | 181 | 386 | 309 | 199 | 437 | 616 |
| 54 | 67 | 182 | 150 | 310 | 784 | 438 | 342 |
| 55 | 41 | 183 | 153 | 311 | 179 | 439 | 316 |
| 56 | 144 | 184 | 165 | 312 | 228 | 440 | 241 |
| 57 | 28 | 185 | 106 | 313 | 338 | 441 | 778 |
| 58 | 69 | 186 | 55 | 314 | 312 | 442 | 563 |
| 607 | 628 | 735 | 693 | 863 | 874 | 991 | 894 |
| 608 | 689 | 736 | 797 | 864 | 918 | 992 | 1009 |
| 609 | 374 | 737 | 906 | 865 | 502 | 993 | 955 |
| 610 | 423 | 738 | 715 | 866 | 933 | 994 | 1004 |
| 611 | 466 | 739 | 807 | 867 | 743 | 995 | 1010 |
| 612 | 793 | 740 | 474 | 868 | 760 | 996 | 957 |
| 613 | 250 | 741 | 636 | 869 | 881 | 997 | 983 |
| 614 | 371 | 742 | 694 | 870 | 494 | 998 | 958 |
| 615 | 481 | 743 | 254 | 871 | 702 | 999 | 987 |
| 616 | 574 | 744 | 717 | 872 | 921 | 1000 | 1012 |
| 617 | 413 | 745 | 575 | 873 | 501 | 1001 | 999 |
| 618 | 603 | 746 | 913 | 874 | 876 | 1002 | 1016 |
| 619 | 366 | 747 | 798 | 875 | 847 | 1003 | 767 |
| 620 | 468 | 748 | 811 | 876 | 992 | 1004 | 989 |
| 621 | 655 | 749 | 379 | 877 | 447 | 1005 | 1003 |
| 622 | 900 | 750 | 697 | 878 | 733 | 1006 | 990 |
| 623 | 805 | 751 | 431 | 879 | 827 | 1007 | 1005 |
| 624 | 615 | 752 | 607 | 880 | 934 | 1008 | 959 |
| 625 | 684 | 753 | 489 | 881 | 882 | 1009 | 1011 |
| 626 | 710 | 754 | 866 | 882 | 937 | 1010 | 1013 |
| 627 | 429 | 755 | 723 | 883 | 963 | 1011 | 895 |
| 628 | 794 | 756 | 486 | 884 | 747 | 1012 | 1006 |
| 629 | 252 | 757 | 908 | 885 | 505 | 1013 | 1014 |
| 630 | 373 | 758 | 718 | 886 | 855 | 1014 | 1017 |
| 631 | 605 | 759 | 813 | 887 | 924 | 1015 | 1018 |
| 632 | 848 | 760 | 476 | 888 | 734 | 1016 | 991 |
| 633 | 690 | 761 | 856 | 889 | 829 | 1017 | 1020 |
| 634 | 713 | 762 | 839 | 890 | 965 | 1018 | 1007 |
| 635 | 632 | 763 | 725 | 891 | 938 | 1019 | 1015 |
| 636 | 482 | 764 | 698 | 892 | 884 | 1020 | 1019 |
| 637 | 806 | 765 | 914 | 893 | 506 | 1021 | 1021 |
| 638 | 427 | 766 | 752 | 894 | 749 | 1022 | 1022 |
| 639 | 904 | 767 | 868 | 895 | 945 | 1023 | 1023 |

TABLE 2

| MCS Index $I_{MCS}$ | Target Rate $R_T$ | Modulation Order $Q_m$ | Bit channel 1 R1 | Bit channel 2 R2 | Bit channel 3 R3 | Bit channel 4 R4 |
|---|---|---|---|---|---|---|
| 0 | 0.2968 | 2 | 0.1484 | X | X | X |
| 1 | 0.4376 | 2 | 0.2188 | X | X | X |
| 2 | 0.6640 | 2 | 0.3320 | X | X | X |
| 3 | 0.9376 | 2 | 0.4688 | X | X | X |
| 4 | 1.2382 | 2 | 0.6191 | X | X | X |
| 5 | 1.5390 | 4 | 0.1250 | 0.6445 | X | X |
| 6 | 1.7578 | 4 | 0.1523 | 0.7266 | X | X |
| 7 | 1.9766 | 4 | 0.1895 | 0.7988 | X | X |
| 8 | 2.2226 | 4 | 0.2441 | 0.8672 | X | X |
| 9 | 2.4688 | 4 | 0.3145 | 0.9199 | X | X |
| 10 | 2.6328 | 4 | 0.3711 | 0.9453 | X | X |
| 11 | 2.7928 | 6 | 0.0527 | 0.3906 | 0.9531 | X |
| 12 | 3.0900 | 6 | 0.0645 | 0.5000 | 0.9805 | X |
| 13 | 3.3828 | 6 | 0.0840 | 0.6133 | 0.9941 | X |
| 14 | 3.6718 | 6 | 0.1172 | 0.7207 | 0.9980 | X |
| 15 | 3.9648 | 6 | 0.1660 | 0.8164 | 1.0000 | X |
| 16 | 4.2734 | 6 | 0.2441 | 0.8926 | 1.0000 | X |

TABLE 2-continued

| MCS Index $I_{MCS}$ | Target Rate $R_T$ | Modulation Order $Q_m$ | Bit channel 1 R1 | Bit channel 2 R2 | Bit channel 3 R3 | Bit channel 4 R4 |
|---|---|---|---|---|---|---|
| 17 | 4.586 | 6 | 0.3457 | 0.9473 | 1.0000 | X |
| 18 | 4.8788 | 6 | 0.4609 | 0.9785 | 1.0000 | X |
| 19 | 5.1758 | 6 | 0.5938 | 0.9941 | 1.0000 | X |
| 20 | 5.3946 | 8 | 0.0645 | 0.6367 | 0.9961 | 1.0000 |
| 21 | 5.6172 | 8 | 0.0898 | 0.7188 | 1.0000 | 1.0000 |
| 22 | 5.9530 | 8 | 0.1484 | 0.8281 | 1.0000 | 1.0000 |
| 23 | 6.2892 | 8 | 0.2383 | 0.9063 | 1.0000 | 1.0000 |
| 24 | 6.6328 | 8 | 0.3574 | 0.9590 | 1.0000 | 1.0000 |
| 25 | 6.9766 | 8 | 0.5020 | 0.9863 | 1.0000 | 1.0000 |
| 26 | 7.2226 | 8 | 0.6152 | 0.9961 | 1.0000 | 1.0000 |
| 27 | 7.4688 | 8 | 0.7344 | 1.0000 | 1.0000 | 1.0000 |

The implementation of the methods and the performance analysis will be described hereinafter in details in conjunction with simulation tests.

Figure 8:
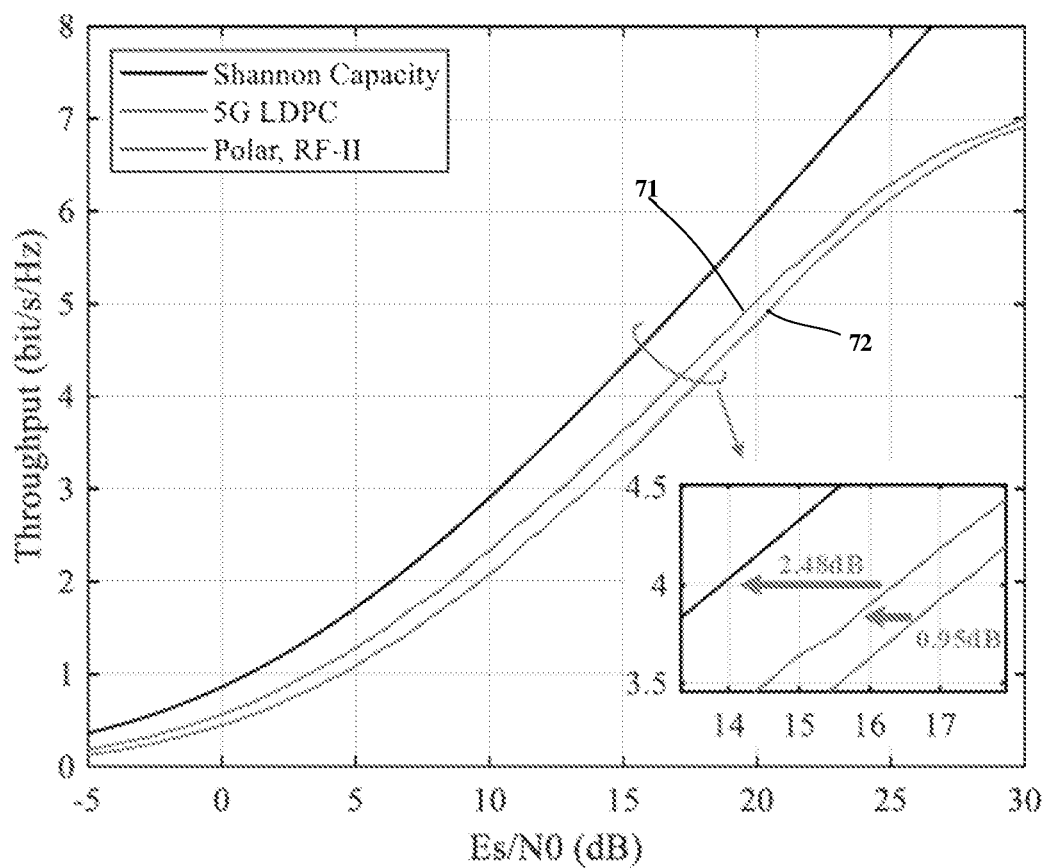
FIG. 8 is a performance simulation diagram of a polar-coded modulation scheme according to an embodiment of the present application.

FIG. 8 shows a link throughput under a block fading channel with 256 symbols. For a self-adaptive modulated and coding scheme, a 5G NR MCS is used to select the code rate and the modulation mode under the condition that a block error rate is smaller than $10^{-1}$. In FIG. 8, a curve 71 corresponding to RF-II indicates the allocation of the code rate based on the finite-code-length channel capacity, and a 5G NR LDPC code corresponds to a curve 72. It can be seen that the throughput for RF-II increases as compared with the 5G NR LDPC code.

Figure 9:
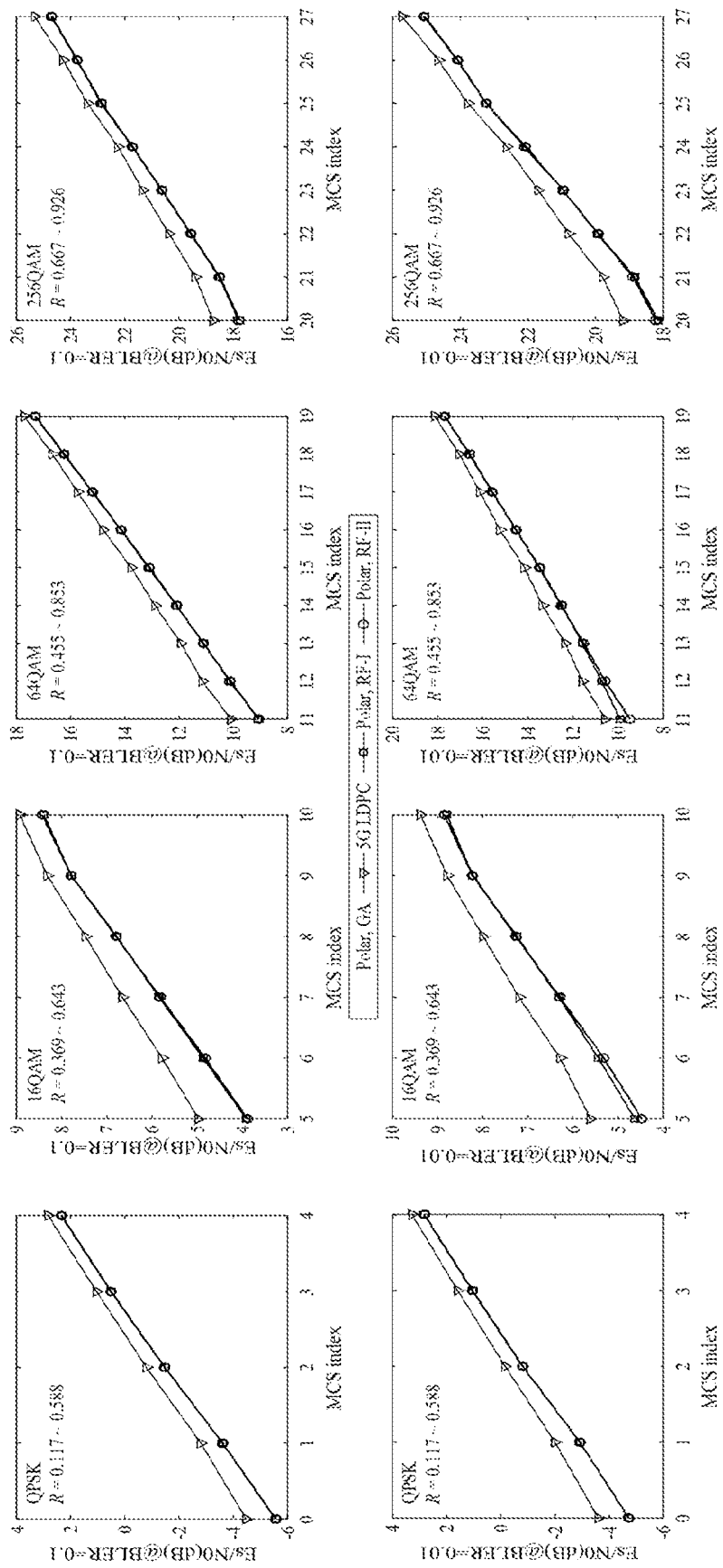
FIG. 9 is another performance simulation diagram of the polar-coded modulation scheme according to an embodiment of the present application.

FIG. 9 shows desired signal-to-noise ratios when block error rates are $10^{-1}$ and $10^{-2}$ under an Additive White Gaussian Noise (AWGN) channel with 256 symbols in different MCSs. In FIG. 9, RF-I indicates the allocation of the code rate based on the channel capacity, and RF-II indicates the allocation of the code rate based on the finite-code-length channel capacity. As shown in FIG. 9, in the two code rate allocation modes RF-I and RF-II, the performance almost identical to that of a Gaussian approximation construction is obtained, and it is better than that of the 5G NR LDPC code.

The methods have been described hereinabove, and devices for implementing the methods will be described hereinafter.

Figure 10:
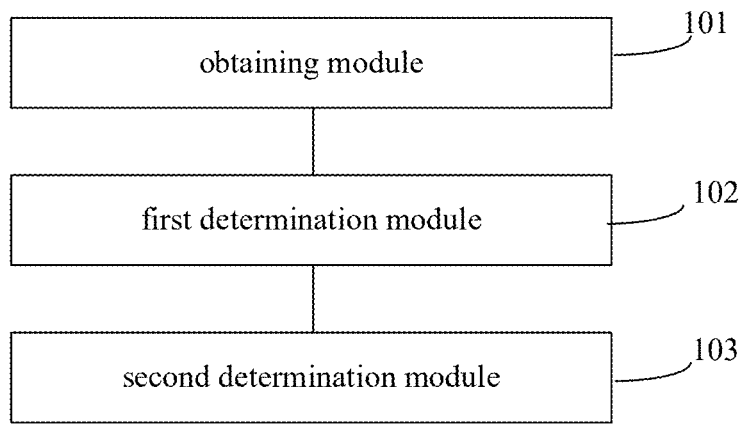
FIG. 10 is a schematic view showing an information bit determination device based on polar-coded modulation according to an embodiment of the present application.

As shown in FIG. 10, the present application provides in some embodiments an information bit determination device for polar-coded modulation, which includes: an obtaining module 101 configured to provide a mapping relationship table for a predefined polar-coded modulation scheme, the mapping relationship table at least including target rates, modulation orders and first parameters of a polar code/component code under different MCS indices; a first determination module 102 configured to determine the quantity of information bits in each polar code/component code in a target polar-coded modulation system in accordance with the mapping relationship table; and a second determination module 103 configured to determine an information bit set corresponding to each polar code/component code in accordance with the quantity of information bits in each polar code/component code in the target polar-coded modulation system, the information bit set being used to indicate a set of positions of the information bits.

In a possible embodiment of the present application, the first parameter is a channel capacity, a code rate or the quantity of information bits of the polar code/component code.

In a possible embodiment of the present application, in the case that the first parameter is the channel capacity of the polar code/component code, the determination module is specifically configured to: determine the channel capacity of each polar code/component code in the target polar-coded modulation system in accordance with the mapping relationship table, and allocate a code rate for each polar code/component code in accordance with a ratio of the channel capacity of each polar code/component code in the target polar-coded modulation system to a total channel capacity; and calculate the quantity of information bits in each polar code/component code in accordance with the code rate for the polar code/component code in the target polar-coded modulation system.

In a possible embodiment of the present application, in the case that the first parameter is the code rate of the polar code/component code, the determination module is specifically configured to: determine a code rate for each polar code/component code in the target polar-coded modulation system in accordance with the mapping relationship table; and calculate the quantity of information bits in each polar code/component code in accordance with the code rate of the polar code/component code in the target polar-coded modulation system.

In a possible embodiment of the present application, the determination module is further configured to calculate the quantity $K_{k_t}$ of information bits allocated for a $(k_t)^{th}$ polar code/component code in the target polar-coded modulation system in accordance with a code rate $R_{k_t}$ allocated for the $(k_t)^{th}$ polar code/component code through $K_{k_t} = \lceil (K_0 - \sum_{t'=1}^{t-1} K_{k_{t'}}) \cdot R_{k_t} \rceil$, where $t=1, 2, \ldots, m_0$, $K_0$ represents the quantity of information bits in the target polar-coded modulation system, and the $(k_t)^{th}$ polar code/component code is a $t^{th}$ polar code/component code in a queue of $m_0$ polar codes/component codes in the target polar-coded modulation system ranked in a descending order of channel capacities of binary input equivalent channels corresponding to the polar codes/component codes.

In a possible embodiment of the present application, the second determination module is specifically configured to: determine an order of degrees of reliability of the polar codes/component codes each having a symbol length of N in accordance with a polarization sequence obtained in advance and a degree of bit sub-channel reliability corresponding to a polar code/component code, to obtain a polar code/component code sequence, the target polar-coded modulation system having a symbol length of N; and determine $K_{k_t}$ polar codes/component codes with a highest degree of reliability in the polar code/component code sequence in accordance with the quantity $K_{k_t}$ of information bits in each polar code/component code in the target polar-coded modulation system, to obtain the information bit set corresponding to each polar code/component code in the target polar-coded modulation system.

Figure 11:
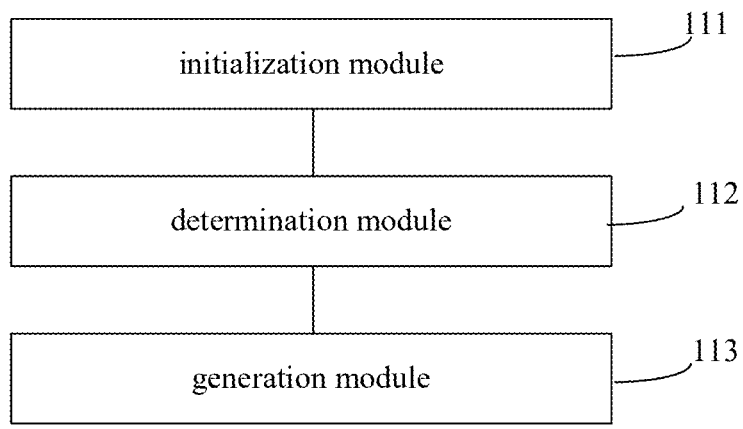
FIG. 11 is a schematic view showing a mapping relationship generation device for polar-coded modulation according to an embodiment of the present application.

As shown in FIG. 11, the present application further provides in some embodiments a mapping relationship generation device for polar-coded modulation, which includes: an initialization module 111 configured to create a polar-coded modulation system, and initialize parameters of a polar-coded modulation scheme; a determination module 112 configured to determine an equivalent channel of the polar-coded modulation system in accordance with target spectrum efficiency of the polar-coded modulation system; and a generation module 113 configured to calculate a channel capability for each polar code/component code in accordance with the equivalent channel, and generate a mapping relationship table for the polar-coded modulation scheme, the mapping relationship table at least including target rates, modulation orders and first parameters of a polar code/component code under different MCS indices.

In a possible embodiment of the present application, the first parameter is a channel capacity, a code rate or the quantity of information bits of the polar code/component code.

In a possible embodiment of the present application, the initialization module is specifically configured to: create the polar-coded modulation system having a code rate of R and a symbol length of N and transmitted on a channel W, where $x \in X$ indicates a modulation symbol with a modulation order of m inputted into the channel W and $|X|=2^m$, $y \in Y$ indicates a symbol outputted by the channel W, $I(X;Y)$ indicates mutual information between an input and an output of the channel W, and for a sequence $b_1^m$ having m bits, a mapping rule of the modulation symbol is expressed as $\varphi:\{0,1\}^m \mapsto X$; divide the channel W into m memoryless binary input channels $W_k$, where $k=1, 2, \ldots, m$, and each $W_k$ corresponds to a polar code/component code with a code length of N; and select K sub-channels with the highest degree of reliability from all of mN polarization sub-channels to carry the information bits, and set an information bit set for a $k^{th}$ polar code/component code as $A_k$, to obtain the quantity K of information bits in the polar-coded modulation system through $K=\Sigma_{k=1}^m |A_k|$, and obtain the code rate R through $$R = \frac{K}{mN}.$$

In a possible embodiment of the present application, the determination module is specifically configured to: determine the target spectrum efficiency $R_T$ of the polar-coded modulation system in accordance with a transmission parameter of the polar-coded modulation system through $R_T=mR$; and determine an equivalent channel $\overline{W}$ in accordance with the target spectrum efficiency so that $I(\overline{W})=R_T=mR$, where $I(\overline{W})$ represents a channel capacity of the equivalent channel $\overline{W}$ and $$I(\overline{W}) = mR = \sum_{x \in X} \sum_{y \in Y} \frac{1}{2^m} \cdot \overline{W}(y|x) \cdot \log_2 \frac{\overline{W}(y|x)}{\sum_{x' \in X} \frac{1}{2^m} \cdot \overline{W}(y|x')}.$$

In a possible embodiment of the present application, generation module is specifically configured to: divide the equivalent channel $\overline{W}$ into m memoryless binary input equivalent channels $\overline{W}_k$, where $k=1, 2, \ldots, m$, and a channel transition probability is $$\overline{W}_k(y, b_1^{k-1} | b_k) = \frac{1}{2^{m-1}} \sum_{b_{k+1}^m \in \{0,1\}^{m-k}} \overline{W}(y | x = \varphi(b_1^m));$$

calculate the channel capacity $I(\overline{W}_k)$ of the equivalent channel $\overline{W}_k$ in accordance with the channel transition probability of the equivalent channel $\overline{W}_k$; and create mapping relationships for the polar-coded modulation system in accordance with the target spectrum efficiency of the polar-coded modulation system and the channel capacity of each equivalent channel, and allocate a respective index for each mapping relationship, to obtain the mapping relationship table for the polar-coded modulation scheme.

In a possible embodiment of the present application, the determination module is specifically configured to: determine the target spectrum efficiency $R_T$ of the polar-coded modulation system through $R_T=mR$; and determine an equivalent channel $\overline{W}$ in accordance with the target spectrum efficiency, to obtain $M(\overline{W},N,\epsilon)=R_T=mR$, where $M(\overline{W},N,\epsilon)$ represents a finite-code-length channel capacity of the equivalent channel $\overline{W}$, N represents a symbol length, $\epsilon$ represents an error probability of the polar-coded modulation system, $$M(\overline{W}, N, \epsilon) = \sum_{k=1}^m M(\overline{W}_k, N, \epsilon_k),$$

$\overline{W}_k$ represents a binary input equivalent channel of a $k^{th}$ polar code/component code, $\epsilon_k$ represents an error probability of the equivalent channel $\overline{W}_k$, and $$\epsilon_k = 1 - (1-\epsilon)^{\frac{1}{m}}, M(\overline{W}_k, N, \epsilon_k) = I(\overline{W}_k) - \sqrt{\frac{V_k}{N}} Q^1(\epsilon_k),$$

$Q(\cdot)$ represents a complementary Gaussian cumulative distribution function, $V_k$ represents channel divergence of the equivalent channel, and $$V_k = \sum_{b_1^k \in \{0,1\}^k} \sum_{y \in Y} \frac{Pr(y|b_1^k)}{2^k} \cdot \left[\log_2 \frac{Pr(y|b_1^k)}{Pr(y|b_1^{k-1})}\right]^2 - I^2(\overline{W}_k).$$

In a possible embodiment of the present application, the generation module is specifically configured to: divide the equivalent channel $\overline{W}$ into m memoryless binary input equivalent channels $\overline{W}_k$, where $k=1, 2, \ldots, m$, and a channel transition probability is $$\overline{W}_k(y, b_1^{k-1} | b_k) = \frac{1}{2^{m-1}} \sum_{b_{k+1}^m \in \{0,1\}^{m-k}} \overline{W}(y | x = \varphi(b_1^m));$$

calculate a (finite-code-length channel capacity $M(\overline{W}_k,N,\epsilon_k)$ of the equivalent channel $\overline{W}_k$ in accordance with the channel transition probability, the symbol length N and the error probability $\epsilon_k$ of the equivalent channel $\overline{W}_k$ through $$M(\overline{W}_k, N, \epsilon_k) = I(\overline{W}_k) - \sqrt{\frac{V_k}{N}} Q^{-1}(\epsilon_k);$$

and create the mapping relationships for the polar-coded modulation system in accordance with the target spectrum efficiency of the polar-coded modulation system and the channel capacity of each equivalent channel, and allocate a respective index for each mapping relationship, to obtain the mapping relationship table for the polar-coded modulation scheme.

In a possible embodiment of the present application, in the mapping relationship, the target rate of the polar-coded modulation system is the target spectrum efficiency of the polar-coded modulation system; when the first parameter is the channel capacity of the polar code/component code, the channel capacity of each equivalent channel is taken as the channel capacity of the corresponding polar code/component code; when the first parameter is the code rate of the polar code/component code, the code rate allocated for each polar code/component code is determined in accordance with a ratio of the channel capacity of each polar code/component code in the polar-coded modulation system to a total channel capacity; and when the first parameter is the quantity of information bits in the polar code/component code, the code rate allocated for each polar code/component code is determined in accordance with the ratio of the channel capacity of each polar code/component code in the polar-coded modulation system to the total channel capacity, and the quantity of information bits in each polar code/component code is determined in accordance with the code rate of the polar code/component code in the polar-coded modulation system.

Figure 12:
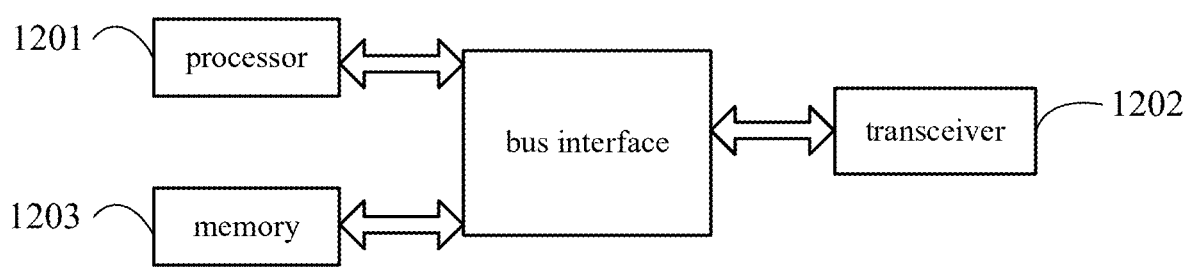
FIG. 12 is a schematic view showing a base station according to an embodiment of the present application.

As shown in FIG. 12, the present application further provides in some embodiments a base station, which includes a processor 1201, a transceiver 1202, a memory 1203 and a bus interface. The base station further includes a program stored in the memory 1203 and executed by the processor 1201. The program is executed by the processor 1201, so as to: provide a mapping relationship table for a predefined polar-coded modulation scheme, the mapping relationship table at least including target rates, modulation orders and first parameters of a polar code/component code under different MCS indices; determine the quantity of information bits in each polar code/component code in a target polar-coded modulation system in accordance with the mapping relationship table; and determine an information bit set corresponding to each polar code/component code in accordance with the quantity of information bits in each polar code/component code in the target polar-coded modulation system, the information bit set being used to indicate a set of positions of the information bits.

It should be appreciated that, the program is executed by the processor so as to implement the above-mentioned method in FIG. 2 with a same technical effect, which will not be repeatedly defined herein.

In FIG. 12, the bus architecture may include a number of buses and bridges connected to each other, so as to connect various circuits for one or more processors 1201 and one or more memories 1203. In addition, as is known in the art, the bus architecture may be used to connect any other circuits, such as a circuit for a peripheral device, a circuit for a voltage stabilizer and a power management circuit. A bus interface may be provided, and the transceiver 1202 may consist of a plurality of elements, i.e., a transmitter and a receiver for communication with any other devices over a transmission medium.

The processor 1201 may take charge of managing the bus architecture as well as general processings. The memory 1203 may store therein data for the operation of the processor 1201.

The present application further provides in some embodiments a computer-readable storage medium storing therein a program. The program is executed by a processor, so as to: provide a mapping relationship table for a predefined polar-coded modulation scheme, the mapping relationship table at least including target rates, modulation orders and first parameters of a polar code/component code under different MCS indices; determine the quantity of information bits in each polar code/component code in a target polar-coded modulation system in accordance with the mapping relationship table; and determine an information bit set corresponding to each polar code/component code in accordance with the quantity of information bits in each polar code/component code in the target polar-coded modulation system, the information bit set being used to indicate a set of positions of the information bits.

The program is used to be executed by the processor so as to implement the above-mentioned method in FIG. 2 with a same technical effect, which will not be repeatedly defined herein.

The present application further provides in some embodiments a base station having a structure similar to that in FIG. 12. The base station further includes a program stored in a memory and executed by a processor. The program is executed by the processor, so as to: create a polar-coded modulation system, and initialize parameters of a polar-coded modulation scheme; determine an equivalent channel of the polar-coded modulation system in accordance with target spectrum efficiency of the polar-coded modulation system; and calculate a channel capability for each polar code/component code in accordance with the equivalent channel, and generate a mapping relationship table for the polar-coded modulation scheme, the mapping relationship table at least including target rates, modulation orders and first parameters of a polar code/component code under different MCS indices.

It should be appreciated that, in the embodiments of the present application, the program is executed by the processor so as to implement the above-mentioned method in FIG. 5 with a same technical effect, which will not be repeatedly defined herein.

The present application further provides in some embodiments a computer-readable storage medium storing therein a program. The program is used to be executed by a processor to: create a polar-coded modulation system, and initialize parameters of a polar-coded modulation scheme; determine an equivalent channel of the polar-coded modulation system in accordance with target spectrum efficiency of the polar-coded modulation system; and calculate a channel capability for each polar code/component code in accordance with the equivalent channel, and generate a mapping relationship table for the polar-coded modulation scheme, the mapping relationship table at least including target rates, modulation orders and first parameters of a polar code/component code under different MCS indices.

The program is executed by the processor so as to implement the above-mentioned method in FIG. 3 with a same technical effect, which will not be repeatedly defined herein.

It should be appreciated that, units and steps described in the embodiments of the present application may be implemented in the form of electronic hardware, or a combination of a computer program and the electronic hardware. Whether or not these functions are executed by hardware or software depends on specific applications or design constraints of the technical solution. Different methods may be adopted with respect to the specific applications so as to achieve the described functions, without departing from the scope of the present application.

It should be further appreciated that, for convenience and clarification, operation procedures of the system, device and units described hereinabove may refer to the corresponding procedures in the method embodiment, and thus will not be repeatedly defined herein.

It should be further appreciated that, the device and method may be implemented in any other ways. For example, the embodiments for the apparatus is merely for illustrative purposes, and the modules or units are provided merely on the basis of their logic functions. During the actual application, some modules or units may be combined together or integrated into another system. Alternatively, some functions of the module or units may be omitted or not executed. In addition, the coupling connection, direct coupling connection or communication connection between the modules or units may be implemented via interfaces, and the indirect coupling connection or communication connection between the modules or units may be implemented in an electrical or mechanical form or in any other form.

The units may be, or may not be, physically separated from each other. The units for displaying may be, or may not be, physical units, i.e., they may be arranged at an identical position, or distributed on a plurality of network elements. Parts or all of the units may be selected in accordance with the practical need, so as to achieve the purpose of the present application.

In addition, the functional units in the embodiments of the present application may be integrated into a processing unit, or the functional units may exist independently, or two or more functional units may be combined together.

In the case that the functional units are implemented in a software form and sold or used as a separate product, they may be stored in a computer-readable medium. Based on this, the technical solutions of the present application, partial or full, or parts of the technical solutions of the present application contributing to the related art, may appear in the form of software products, which may be stored in a storage medium and include several instructions so as to enable computer equipment (a personal computer, a server or network equipment) to execute all or parts of the steps of the method according to the embodiments of the present application. The storage medium includes any medium capable of storing therein program codes, e.g., a universal serial bus (USB) flash disk, a mobile hard disk (HD), a read-only memory (ROM), a random access memory (RAM), a magnetic disk or an optical disk.

The above are only specific embodiments of the application, but the protection scope of the present application is not limited thereto. A person skilled in the art can easily conceive changes or replacements, which should be covered within the protection scope of the present application. Therefore, the protection scope of the present application should be defined by the protection scope of the claims.

What is claimed is:

1. An information bit determination method for polar-coded modulation, comprising:
   providing a mapping relationship table for a predefined polar-coded modulation scheme, the mapping relationship table at least comprising target rates, modulation orders and first parameters of a polar code/component code under respective different Modulation and Coding Scheme (MCS) indices;
   determining a quantity of information bits in each polar code/component code in a target polar-coded modulation system in accordance with the mapping relationship table;
   determining an information bit set corresponding to each polar code/component code in accordance with the quantity of information bits in each polar code/component code in the target polar-coded modulation system, wherein the information bit set is used to indicate a set of positions of the information bits,
   wherein the first parameter is a channel capacity, a code rate or the quantity of information bits of the polar code/component code;
   in the mapping relationship, the target rate of the polar-coded modulation system is target spectrum efficiency of the polar-coded modulation system.

2. The information bit determination method according to claim 1, wherein in the case that the first parameter is the channel capacity of the polar code/component code, the determining the quantity of information bits in each polar code/component code in the target polar-coded modulation system in accordance with the mapping relationship table comprises:
   determining the channel capacity of each polar code/component code in the target polar-coded modulation system in accordance with the mapping relationship table, and allocating a code rate for each polar code/component code in accordance with a ratio of the channel capacity of each polar code/component code in the target polar-coded modulation system to a total channel capacity;
   calculating the quantity of information bits in each polar code/component code in accordance with the code rate for the polar code/component code in the target polar-coded modulation system.

3. The information bit determination method according to claim 2, wherein the calculating the quantity of information bits in each polar code/component code in accordance with the code rate of the polar code/component code in the target polar-coded modulation system comprises:
   calculating the quantity $K_{k_t}$ of information bits allocated for a $(k_t)^{th}$ polar code/component code in the target polar-coded modulation system in accordance with a code rate $R_{k_t}$ allocated for the $(k_t)^{th}$ polar code/component code through $$K_{k_t} = \left[\left(K_0 - \sum_{t'=1}^{t-1} K_{k_{t'}}\right) \cdot R_{k_t}\right],$$

where t=1,2, . . . , $m_0$, $K_0$ represents the quantity of information bits in the target polar-coded modulation system, and the $(k_t)^{th}$ polar code/component code is a $t^{th}$ polar code/component code in a queue of $m_0$ polar codes/component codes in the target polar-coded modulation system ranked in a descending order of channel capacities of binary input equivalent channels corresponding to the polar codes/component codes.

4. The information bit determination method according to claim 1, wherein in the case that the first parameter is the code rate of the polar code/component code, the determining the quantity of information bits in each polar code/component code in the target polar-coded modulation system in accordance with the mapping relationship table comprises:
    determining a code rate for each polar code/component code in the target polar-coded modulation system in accordance with the mapping relationship table;
    calculating the quantity of information bits in each polar code/component code in accordance with the code rate of the polar code/component code in the target polar-coded modulation system.

5. The information bit determination method according to claim 4, wherein the calculating the quantity of information bits in each polar code/component code in accordance with the code rate of the polar code/component code in the target polar-coded modulation system comprises:
    calculating the quantity $K_{k_t}$ of information bits allocated for a $(k_t)^{th}$ polar code/component code in the target polar-coded modulation system in accordance with a code rate $R_{k_t}$ allocated for the $(k_t)^{th}$ polar code/component code through $$K_{k_t} = \left[ \left(K_0 - \sum_{t'=1}^{t-1} K_{k_{t'}} \right) \cdot R_{k_t} \right],$$

where t=1,2, ..., $m_0$, $K_0$ represents the quantity of information bits in the target polar-coded modulation system, and the $(k_t)^{th}$ polar code/component code is a $t^{th}$ polar code/component code in a queue of $m_0$ polar codes/component codes in the target polar-coded modulation system ranked in a descending order of channel capacities of binary input equivalent channels corresponding to the polar codes/component codes.

6. The information bit determination method according to claim 1, wherein the determining the information bit set corresponding to each polar code/component code in accordance with the quantity of information bits in each polar code/component code in the target polar-coded modulation system comprises:
    determining an order of degrees of reliability of the polar codes/component codes each having a symbol length of N in accordance with a polarization sequence obtained in advance and a degree of bit sub-channel reliability corresponding to a polar code/component code, to obtain a polar code/component code sequence, the target polar-coded modulation system having a symbol length of N;
    determining $K_{k_t}$ polar codes/component codes with a highest degree of reliability in the polar code/component code sequence in accordance with the quantity $K_{k_t}$ of information bits in each polar code/component code in the target polar-coded modulation system, to obtain the information bit set corresponding to each polar code/component code in the target polar-coded modulation system.

7. A mapping relationship generation method for polar-coded modulation, comprising:
    creating a polar-coded modulation system, and initializing a parameter of a polar-coded modulation scheme in accordance with a modulation order of a polar code/component code;
    determining an equivalent channel of the polar-coded modulation system in accordance with target spectrum efficiency of the polar-coded modulation system;
    calculating a channel capability for each polar code/component code in accordance with the equivalent channel, and generating a mapping relationship table for the polar-coded modulation scheme, the mapping relationship table at least comprising target rates, modulation orders and first parameters of the polar code/component code under different Modulation and Coding Scheme (MCS) indices,
    wherein in the mapping relationship, the target rate of the polar-coded modulation system is the target spectrum efficiency of the polar-coded modulation system;
    wherein the first parameter is a channel capacity, a code rate or a quantity of information bits of the polar code/component code.

8. The mapping relationship generation method according to claim 7, wherein the creating the polar-coded modulation system and initializing the parameters of the polar-coded modulation scheme comprises:
    creating the polar-coded modulation system having a code rate of R and a symbol length of N and transmitted on a channel W, where x∈ X indicates a modulation symbol with a modulation order of m inputted into the channel W and $|X|=2^m$, y∈ Y indicates a symbol outputted by the channel W, I(X;Y) indicates mutual information between an input and an output of the channel W, and for a sequence $b_1^m$ having m bits, a mapping rule of the modulation symbol is expressed as $$\varphi:\{0, 1\}^m \mapsto X;$$

dividing the channel W into m memoryless binary input channels $W_k$, where k=1,2, ..., m, and each $W_k$ corresponds to a polar code/component code with a code length of N;
selecting K sub-channels with the highest degree of reliability from all of mN polarization sub-channels to carry the information bits, and setting an information bit set for a $k^{th}$ polar code/component code as $A_k$, to obtain the quantity K of information bits in the polar-coded modulation system through $$K = \sum_{k=1}^{m} |A_k|,$$

and obtain the code rate R through $$R = \frac{K}{mN}.$$

9. The mapping relationship generation method according to claim 8, wherein the determining the equivalent channel of the polar-coded modulation system in accordance with the target spectrum efficiency of the polar-coded modulation system comprises:
    determining the target spectrum efficiency $R_T$ of the polar-coded modulation system in accordance with a transmission parameter of the polar-coded modulation system through $R_T=mR$;
    determining an equivalent channel $$\overline{W}$$

in accordance with the target spectrum efficiency, to obtain $$I(\overline{W}) = R_T = mR, \text{ where } I(\overline{W})$$

represents a channel capacity of the equivalent channel $$\overline{W},$$

and $$I(\overline{W}) = mR = \sum_{x \in \mathcal{X}} \sum_{y \in \mathcal{Y}} \frac{1}{2^m} \cdot \overline{W}(y|x) \cdot \log_2 \frac{\overline{W}(y|x)}{\sum_{x' \in \mathcal{X}} \frac{1}{2^m} \cdot \overline{W}(y|x')}.$$

10. The mapping relationship generation method according to claim 9, wherein the calculating the channel capacity of each polar code/component code in accordance with the equivalent channel and generating the mapping relationship table for the polar-coded modulation scheme comprises:
dividing the equivalent channel $$\overline{W}$$

into m memoryless binary input equivalent channels $$\overline{W}_k,$$

where k=1,2, ..., m, and a channel transition probability is $$\overline{W}_k(y, b_1^{k-1} | b_k) = \frac{1}{2^{m-1}} \sum_{b_{k+1}^m \in \{0,1\}^{m-k}} \overline{W}(y | x = \varphi(b_1^m));$$

calculating the channel capacity $$I(\overline{W}_k)$$

of the equivalent channel $$\overline{W}_k$$

in accordance with the channel transition probability of the equivalent channel $$\overline{W}_k;$$

creating mapping relationships for the polar-coded modulation system in accordance with the target spectrum efficiency of the polar-coded modulation system and the channel capacity of each equivalent channel, and allocating a respective index for each mapping relationship, to obtain the mapping relationship table for the polar-coded modulation scheme.

11. The mapping relationship generation method according to claim 10, wherein in the mapping relationship:
when the first parameter is the channel capacity of the polar code/component code, the channel capacity of each equivalent channel is taken as the channel capacity of the corresponding polar code/component code;
when the first parameter is the code rate of the polar code/component code, the code rate allocated for each polar code/component code is determined in accordance with a ratio of the channel capacity of each polar code/component code in the polar-coded modulation system to a total channel capacity;
when the first parameter is the quantity of information bits in the polar code/component code, the code rate allocated for each polar code/component code is determined in accordance with the ratio of the channel capacity of each polar code/component code in the polar-coded modulation system to the total channel capacity, and the quantity of information bits in each polar code/component code is determined in accordance with the code rate of the polar code/component code in the polar-coded modulation system.

12. The mapping relationship generation method according to claim 7, wherein the determining the equivalent channel of the polar-coded modulation system in accordance with the target spectrum efficiency of the polar-coded modulation system comprises:
determining the target spectrum efficiency $R_T$ of the polar-coded modulation system through $R_T$=mR;
determining an equivalent channel $$\overline{W}$$

in accordance with the target spectrum efficiency, to obtain $$M(\overline{W}, N, \epsilon) = R_T = mR,$$

where $$M(\overline{W}, N, \epsilon)$$

represents a finite-code-length channel capacity of the equivalent channel $$\overline{W},$$

N represents a symbol length, $\epsilon$ represents an error probability of the polar-coded modulation system, $$M(\overline{W}, N, \epsilon) = \sum_{k=1}^{m} M(\overline{W}_k, N, \epsilon_k),$$

$$\overline{W}_k$$

represents a binary input equivalent channel of a $k^{th}$ polar code/component code, $\epsilon_k$ represents an error probability of the equivalent channel $$\overline{W}_k,$$

and $$\epsilon_k = 1 - (1-\epsilon)^{\frac{1}{m}},$$

$$M(\overline{W}_k, N, \epsilon_k) = I(\overline{W}_k) - \sqrt{\frac{V_k}{N}} Q^{-1}(\epsilon_k),$$

$Q(\cdot)$ represents a complementary Gaussian cumulative distribution function, $V_k$ represents channel divergence of the equivalent channel, and $$V_k = \sum_{b_1^k \in \{0,1\}^k} \sum_{y \in \mathcal{Y}} \frac{Pr(y|b_1^k)}{2^k} \cdot \left[\log_2 \frac{Pr(y|b_1^k)}{Pr(y|b_1^{k-1})}\right]^2 - I^2(\overline{W}_k).$$

13. The mapping relationship generation method according to claim 12, wherein the calculating the channel capacity of each polar code/component code in accordance with the equivalent channel and generating the mapping relationship table for the polar-coded modulation scheme comprises:

dividing the equivalent channel $$W$$

into m memoryless binary input equivalent channels $$\overline{W}_k$$

where k=1, 2, . . . , m, and a channel transition probability is $$\overline{W}_k(y, b_1^{k-1}|b_k) = \frac{1}{2^{m-1}} \sum_{b_{k+1}^m \in \{0,1\}^{m-k}} W(y|x = \varphi(b_1^m));$$

calculating a finite-code-length channel capacity $$M(\overline{W}_k, N, \epsilon_k)$$

of the equivalent channel $$\overline{W}_k$$

in accordance with the channel transition probability, the symbol length N and the error probability $\epsilon_k$ of the equivalent channel $$\overline{W}_k$$

through $$M(\overline{W}_k, N, \epsilon_k) = I(\overline{W}_k) - \sqrt{\frac{V_k}{N}} Q^{-1}(\epsilon_k);$$

creating the mapping relationships for the polar-coded modulation system in accordance with the target spectrum efficiency of the polar-coded modulation system and the channel capacity of each equivalent channel, and allocating a respective index for each mapping relationship, to obtain the mapping relationship table for the polar-coded modulation scheme.

14. A mapping relationship generation device for polar-coded modulation, wherein the information bit determination device comprises a processor, a memory and a program stored in the memory and used to be executed by the processor, and the processor is configured to execute the program to implement the mapping relationship generation method according to claim 7.

15. An information bit determination device for polar-coded modulation, wherein the information bit determination device comprises a processor, a memory and a program stored in the memory and used to be executed by the processor, and the processor is configured to execute the program to:

provide a mapping relationship table for a predefined polar-coded modulation scheme, the mapping relationship table at least comprising target rates, modulation orders and first parameters of a polar code/component code under respective different Modulation and Coding Scheme (MCS) indices;

determine a quantity of information bits in each polar code/component code in a target polar-coded modulation system in accordance with the mapping relationship table;

determine an information bit set corresponding to each polar code/component code in accordance with the quantity of information bits in each polar code/component code in the target polar-coded modulation system, wherein the information bit set is used to indicate a set of positions of the information bits, wherein the first parameter is a channel capacity, a code rate or the quantity of information bits of the polar code/component code;

in the mapping relationship, the target rate of the polar-coded modulation system is target spectrum efficiency of the polar-coded modulation system.

16. The information bit determination device according to claim 15, wherein in the case that the first parameter is the channel capacity of the polar code/component code, the determining the quantity of information bits in each polar code/component code in the target polar-coded modulation system in accordance with the mapping relationship table comprises:

determining the channel capacity of each polar code/component code in the target polar-coded modulation system in accordance with the mapping relationship table, and allocating a code rate for each polar code/component code in accordance with a ratio of the channel capacity of each polar code/component code in the target polar-coded modulation system to a total channel capacity;

calculating the quantity of information bits in each polar code/component code in accordance with the code rate for the polar code/component code in the target polar-coded modulation system.

17. The information bit determination device according to claim 15, wherein in the case that the first parameter is the code rate of the polar code/component code, the determining the quantity of information bits in each polar code/component code in the target polar-coded modulation system in accordance with the mapping relationship table comprises:

determining a code rate for each polar code/component code in the target polar-coded modulation system in accordance with the mapping relationship table;

calculating the quantity of information bits in each polar code/component code in accordance with the code rate of the polar code/component code in the target polar-coded modulation system.

\* \* \* \* \*